(12) United States Patent
Mou et al.

(10) Patent No.: US 10,800,653 B2
(45) Date of Patent: Oct. 13, 2020

(54) MANUFACTURING METHOD OF MICRO CHANNEL STRUCTURE

(71) Applicant: Microjet Technology Co., Ltd., Hsinchu (TW)

(72) Inventors: Hao-Jan Mou, Hsinchu (TW); Rong-Ho Yu, Hsinchu (TW); Cheng-Ming Chang, Hsinchu (TW); Hsien-Chung Tai, Hsinchu (TW); Wen-Hsiung Liao, Hsinchu (TW); Chi-Feng Huang, Hsinchu (TW); Yung-Lung Han, Hsinchu (TW); Chang-Yen Tsai, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 16/661,508

(22) Filed: Oct. 23, 2019

(65) Prior Publication Data
US 2020/0140264 A1 May 7, 2020

(30) Foreign Application Priority Data
Nov. 7, 2018 (TW) .............................. 107139568 A

(51) Int. Cl.
| | | |
|---|---|---|
| F04B 19/00 | (2006.01) | |
| F04B 37/00 | (2006.01) | |
| B82Y 40/00 | (2011.01) | |
| H01L 29/04 | (2006.01) | |
| B81C 1/00 | (2006.01) | |
| F16K 99/00 | (2006.01) | |

(52) U.S. Cl.
CPC ...... *B81C 1/00071* (2013.01); *B81C 1/00119* (2013.01); *B81C 1/00166* (2013.01); *B81C 1/00492* (2013.01); *F16K 99/0048* (2013.01)

(58) Field of Classification Search
CPC combination set(s) only.
See application file for complete search history.

(56) References Cited

U.S. PATENT DOCUMENTS

| | | | |
|---|---|---|---|
| 6,241,905 B1 * | 6/2001 | Silverbrook | ......... B41J 2/14427 216/27 |
| 6,290,861 B1 * | 9/2001 | Silverbrook | ......... B41J 2/14427 216/27 |
| 2005/0052514 A1 * | 3/2005 | Silverbrook | ........... B41J 2/1628 347/94 |

FOREIGN PATENT DOCUMENTS

| | | |
|---|---|---|
| CN | 102308090 B | 12/2015 |
| TW | 200618100 A | 6/2006 |
| TW | M562342 U | 6/2018 |

(Continued)

*Primary Examiner* — Nadine G Norton
*Assistant Examiner* — Mahmoud Dahimene
(74) *Attorney, Agent, or Firm* — Birch, Stewart, Kolasch & Birch, LLP

(57) ABSTRACT

A manufacturing method of micro channel structure is disclosed and includes steps of: providing a substrate; depositing and etching to form a first insulation layer; depositing and etching to form a supporting layer; depositing and etching to form a valve layer; depositing and etching to form a second insulation layer; depositing and etching to form a vibration layer, a lower electrode layer and a piezoelectric actuating layer; providing a photoresist layer and depositing and etching to form a plurality of bonding pads; depositing and etching to from a mask layer; etching to form a first chamber; and etching to form a second chamber.

18 Claims, 22 Drawing Sheets

(56) References Cited

FOREIGN PATENT DOCUMENTS

TW            I635041 B     9/2018

* cited by examiner

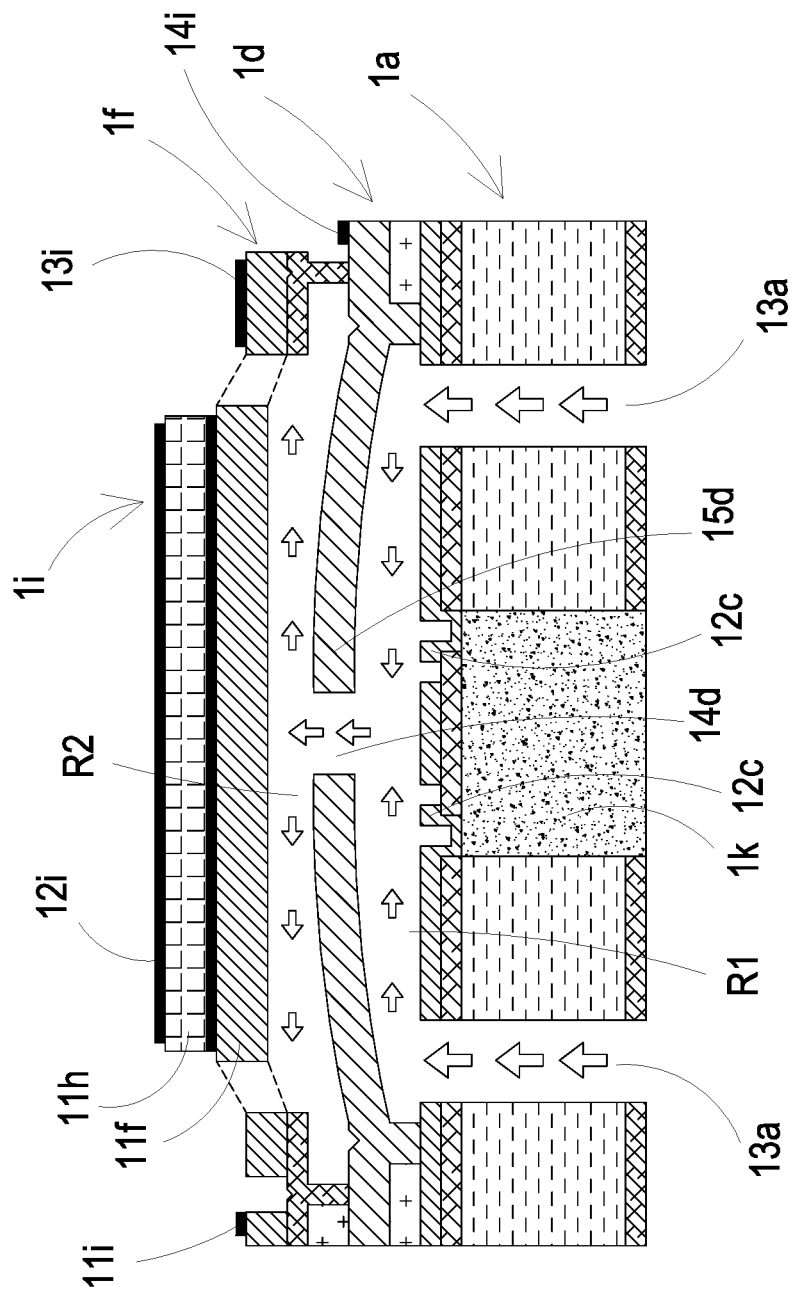

1

MANUFACTURING METHOD OF MICRO CHANNEL STRUCTURE

FIELD OF THE DISCLOSURE

The present disclosure relates to a manufacturing method of a micro channel structure, and more particularly to a manufacturing method of a micro channel structure driven by driving power sources having different phases.

BACKGROUND OF THE DISCLOSURE

Currently, in all fields, the products used in many sectors such as pharmaceutical industries, computer techniques, printing industries or energy industries are developed toward elaboration and miniaturization. The fluid transportation devices are important components that are used in for example micro pumps, micro atomizers, printheads or the industrial printers.

With the rapid advancement of science and technology, the application of fluid transportation device tends to be more and more diversified. For the industrial applications, the biomedical applications, the healthcare, the electronic cooling and so on, even the most popular wearable devices, the fluid transportation device is utilized therein. It is obviously that the conventional fluid transportation devices gradually tend to miniaturize the structure and maximize the flow rate thereof.

In the prior art, the miniaturized fluid transportation structure has been made by micro-electromechanical system (MEMS) process and integrally formed into one piece. However, when in use, the conventional miniaturized fluid transporting structure fails to be implanted to transport the gas due to different ways of actions. Therefore, how to utilize an innovative miniaturized fluid transporting structure to break through the bottleneck of the prior art has become an important part of development.

SUMMARY OF THE DISCLOSURE

The object of the present disclosure is to provide a manufacturing method of a micro channel structure. Being manufactured by a standardized micro-electromechanical system (MEMS) process, the micro channel structure can be driven by driving power sources having different phases to achieve fluid transportation. Therefore, the costs of development and mass production are low. Moreover, the structural size and flatness of the micro channel structure of the present disclosure are stable, and it benefits to make the reliability and service life of the operation increase.

In accordance with an aspect of the present disclosure, there is provided a manufacturing method of a micro channel structure. The manufacturing method of the micro channel structure includes steps of: (a) providing a substrate, wherein the substrate has a first surface and a second surface opposite to each other; (b) depositing and etching to form a first insulation layer, wherein an insulation material is deposited on the first surface of the substrate to form the first insulation layer and etching is performed to form at least one first aperture and at least one second aperture on the first insulation layer, wherein the at least one second aperture is disposed around the at least one first aperture; (c) depositing and etching to form a supporting layer, wherein a conductive material is deposited on the first insulation layer to form the supporting layer, and etching is performed to form a protruding part and a conductive part; (d) depositing and etching to form a valve layer, wherein an oxide material is deposited on the supporting layer to form a first oxide layer, and etching is performed to form a first anchor zone, after which a conductive material is deposited on the first oxide layer and the first anchor zone to form the valve layer, and the valve layer is etched to form a base part with a specified height, a movable part, a fixed part, and a hollow aperture; (e) depositing and etching to form a second insulation layer, wherein an oxide material is deposited on the valve layer to form a second oxide layer, etching is performed to form a second anchor zone, after which an insulation material is deposited on the second oxide layer and the second anchor zone to form the second insulation layer, and the second insulation layer is etched to form a supporting part with a specified height; (f) depositing and etching to form a vibration layer, a lower electrode layer and a piezoelectric actuation layer, wherein a conductive materials is deposited on the second insulation layer to form the vibration layer, a metallic material is deposited on the vibration layer to form the lower electrode layer, and a piezoelectric material is deposited on the lower electrode layer to form the piezoelectric actuation layer, wherein the lower electrode layer and the piezoelectric actuation layer are etched to have desired dimensions and to form a suspension part, an outer frame, at least one connection part and a bonding-pad part on the vibration layer, wherein at least one vacant space is formed among the suspension part, the outer frame and the at least one connection part; (g) providing a photoresist layer to deposit and etch a plurality of bonding pads, wherein a photoresist material is deposited on the piezoelectric actuation layer and the vibration layer to form the photoresist layer, and the photoresist layer is etched to form a plurality of recess zones, wherein the plurality of recess zones are aligned with the position of the fixed part of the valve layer, the position of the outer frame of the vibration layer, the position of the piezoelectric actuation layer and the position of the bonding-pad part, respectively, after which a metallic material is deposited on the plurality of recess zones to form a bonding-pad layer and the bonding-pad layer is etched to form the plurality of bonding pads, wherein the plurality of bonding pads are defined as a reference electrode bonding pad formed on the bonding-pad part of the vibration layer, an upper electrode bonding pad formed on the piezoelectric actuation layer, a lower electrode bonding pad formed on a lateral side of the outer frame of the vibration layer, and a valve-layer electrode bonding pad formed on the fixed part of the valve layer; (h) depositing and etching to form a mask layer, wherein a silicon oxide material is deposited on the second surface of the substrate to form the mask layer, after which etching is performed to form at least one flow channel and a receiving slot in the substrate, wherein the at least one flow channel is spatially corresponding to the position of the at least one second aperture of the first insulation layer, and the receiving slot and the conducive part of the supporting layer are in electrical connection with each other, wherein a base electrode bonding pad is formed by filling a polymer conductive material into the receiving slot, so that the base electrode bonding pad and the conducive part of the supporting layer are in electrical connection with each other; (i) etching to form a first chamber, wherein etching is performed through the at least one flow channel of the substrate to release and remove the first oxide layer surrounded by the base part of the valve layer, so as to form the first chamber surrounded by the base part and to make the hollow aperture of the valve layer in fluid communication with the first chamber; and (j) etching to form a second chamber, wherein etching is performed through the at least one vacant space to release and remove the second oxide layer surrounded by the supporting part of the second insulation layer, so as to form the second chamber surrounded by the supporting part and to make the second chamber and the first chamber in fluid communication with each other through the hollow aperture.

The above contents of the present disclosure will become more readily apparent to those ordinarily skilled in the art after reviewing the following detailed description and accompanying drawings, in which:

BRIEF DESCRIPTION OF THE DRAWINGS

FIGS. 5B to 5D are cross sectional views illustration actions of the micro channel structure of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
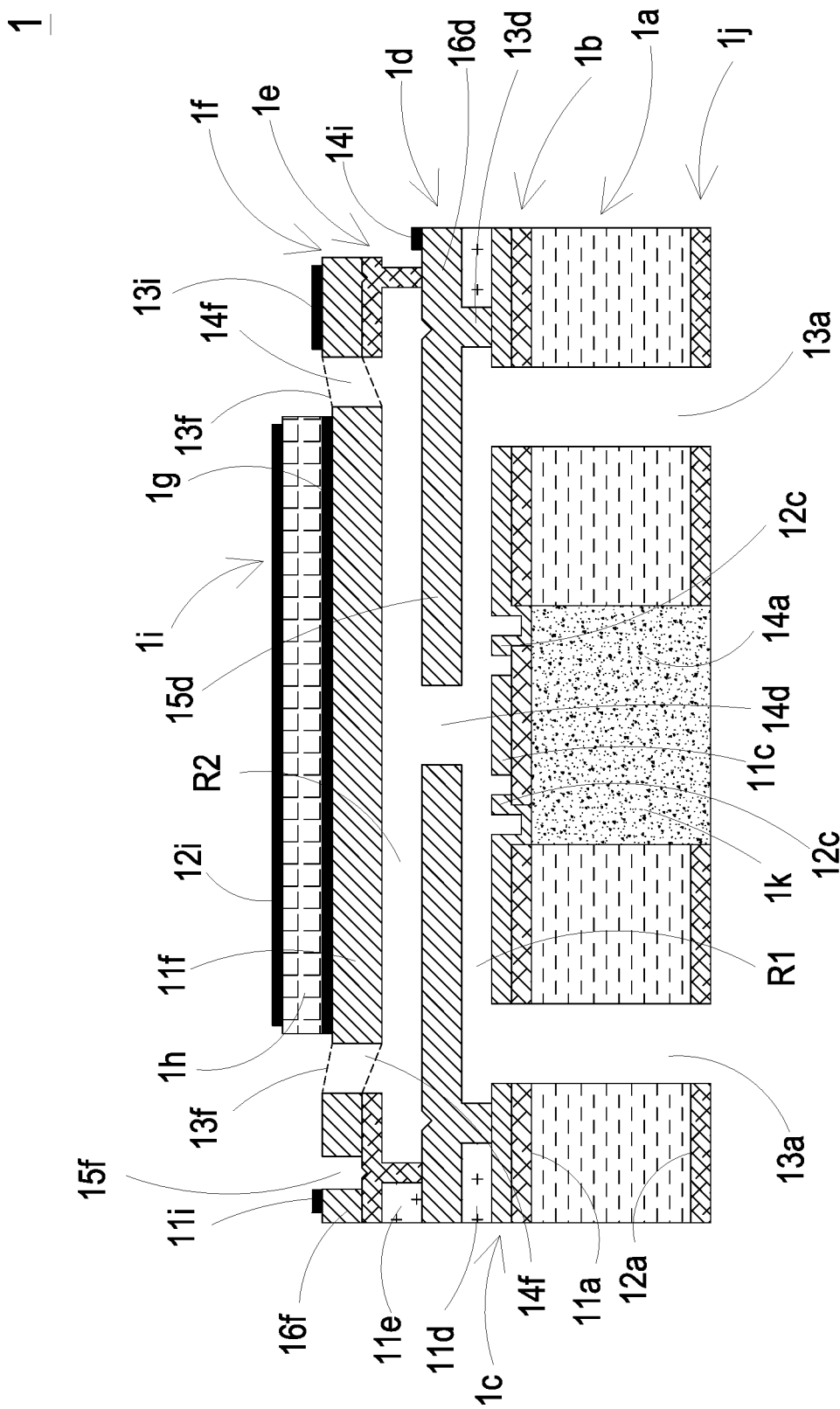
FIG. 1 is a cross sectional view illustrating a micro channel structure according to an embodiment of the present disclosure.

Please refer to FIG. 1. The present disclosure provides a micro channel structure 1 including at least one substrate 1a, at least one first surface 11a, at least one second surface 12a, at least one first insulation layer 1b, at least one insulation material, at least one supporting layer 1c, at least one conductive material, at least one protruding part 11c, at least one conductive part 12c, at least one valve layer 1d, at least one first oxide layer 11d, at least one first anchor zone 12d, at least one base part 13d with a height, at least one movable part 15d, at least one fixed part 16d, at least one hollow aperture 14d, at least one second insulation layer 1e, at least one second oxide layer 11e, at least one second anchor zone 12e, at least one insulation material, at least one supporting part 13e with a height, at least one vibration layer 1f, at least one low electrode layer 1g, at least one piezoelectric actuation layer 1h, at least one metallic material, at least one piezoelectric material, at least one suspension part 11f, at least one outer frame 12f, at least one bonding-pad part 16f, at least one photoresist layer M, at least one photoresist material, at least one bonding-pad layer 1i, at least one reference electrode bonding pad 11i, at least one upper electrode bonding pad 12i, at least one lower electrode bonding pad 13i, at least one valve-layer electrode bonding pad 14i, at least one mask layer 1j, at least one receiving slot 14a, at least one base electrode bonding pad 1k, at least one first chamber R1 and at least one second chamber R2. The numbers of the substrate 1a, the first surface 11a, the second surface 12a, the first insulation layer 1b, the insulation material, the supporting layer 1c, the conductive material, the protruding part 11c, the conductive part 12c, the valve layer 1d, the first oxide layer 11d, the first anchor zone 12d, the base part 13d with the height, the movable part 15d, the fixed part 16d, the hollow aperture 14d, the second insulation layer 1e, the second oxide layer 11e, the second anchor zone 12e, the insulation material, the supporting part 13e with the height, the vibration layer 1f, the low electrode layer 1g, the piezoelectric actuation layer 1h, the metallic materials, the piezoelectric material, the suspension part 11f, the outer frame 12f, the bonding-pad part 16f, the photoresist layer M, the photoresist material, the bonding-pad layer 1i, the reference electrode bonding pad 11i, the upper electrode bonding pad 12i, the lower electrode bonding pad 13i, the valve-layer electrode bonding pad 14i, the mask layer 1j, the receiving slot 14a, the base electrode bonding pad 1k, the first chamber R1 and the second chamber R2 are exemplified by one for each respectively in the following embodiments but not limited thereto. It is noted that each of the substrate 1a, the first surface 11a, the second surface 12a, the first insulation layer 1b, the insulation material, the supporting layer 1c, the conductive material, the protruding part 11c, the conductive part 12c, the valve layer 1d, the first oxide layer 11d, the first anchor zone 12d, the base part 13d with the height, the movable part 15d, the fixed part 16d, the hollow aperture 14d, the second insulation layer 1e, the second oxide layer 11e, the second anchor zone 12e, the insulation material, the supporting part 13e with the height, the vibration layer 1f, the low electrode layer 1g, the piezoelectric actuation layer 1h, the metallic materials, the piezoelectric material, the suspension part 11f, the outer frame 12f, the bonding-pad part 16f, the photoresist layer M, the photoresist material, the bonding-pad layer 1i, the reference electrode bonding pad 11i, the upper electrode bonding pad 12i, the lower electrode bonding pad 13i, the valve-layer electrode bonding pad 14i, the mask layer 1j, the receiving slot 14a, the base electrode bonding pad 1k, the first chamber R1 and the second chamber R2 can also be provided in plural numbers.

The micro channel structure of the present disclosure is used to transport fluid (e.g., gas or liquid) and to increase or control the flow rate of the fluid. Please refer to FIG. 1. In the embodiment, the micro channel structure 1 includes a substrate 1a, a first insulation layer 1b, a supporting layer 1c, a valve layer 1d, a second insulation layer 1e, a vibration layer 1f, a low electrode layer 1g, a piezoelectric actuation layer 1h, a bonding-pad layer 1i, and a mask layer 1j. —The manufacturing method is described as follows.

Figure 2:
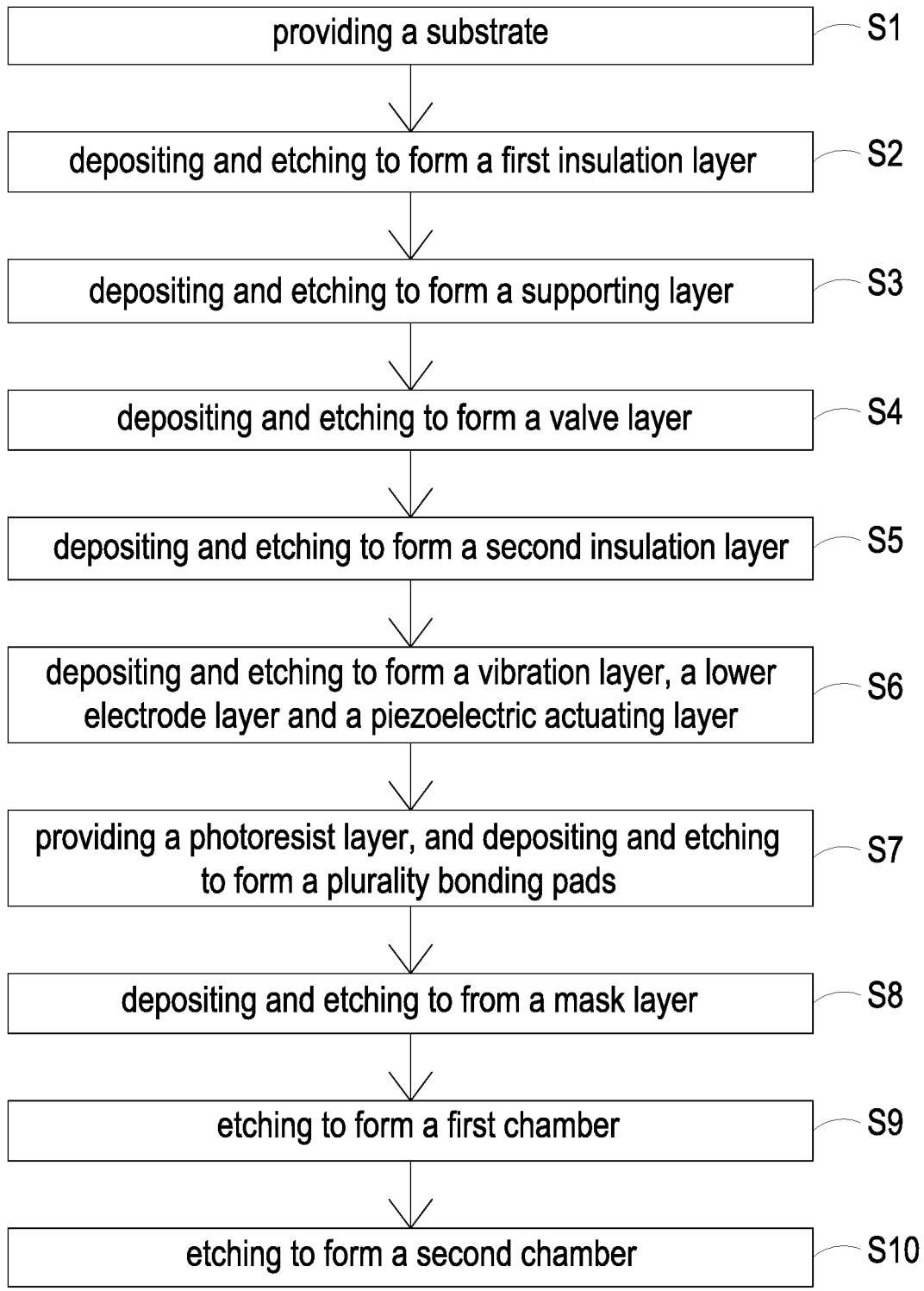
FIG. 2 is a flow chart illustrating a manufacturing method of a micro channel structure according to an embodiment of the present disclosure.
Figure 3A:
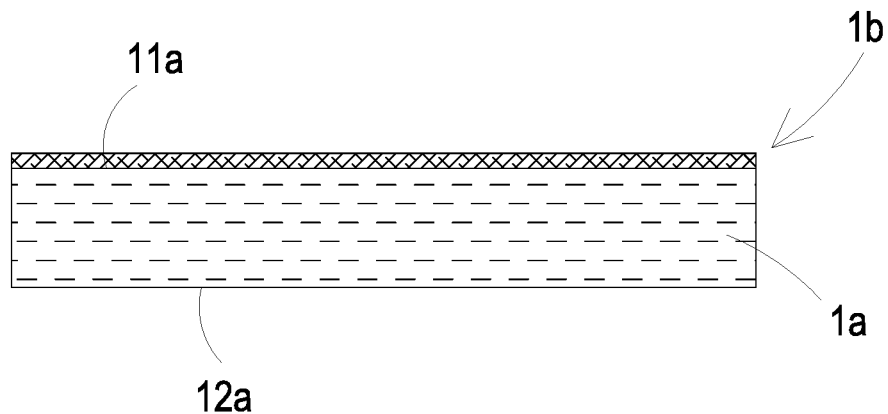
FIGS. 3A to 3Z are cross sectional views illustrating each steps of the manufacturing method of the micro channel structure according to the embodiment of the present disclosure.

Please refer to FIGS. 2 and 3A. In the embodiment, at the step S1, a substrate 1a is provided. The substrate 1a is made of a polysilicon material. The substrate 1a has a first surface 11a and a second surface 12a. The first surface 11a and the second surface 12a are opposite to each other.

Figure 3B:
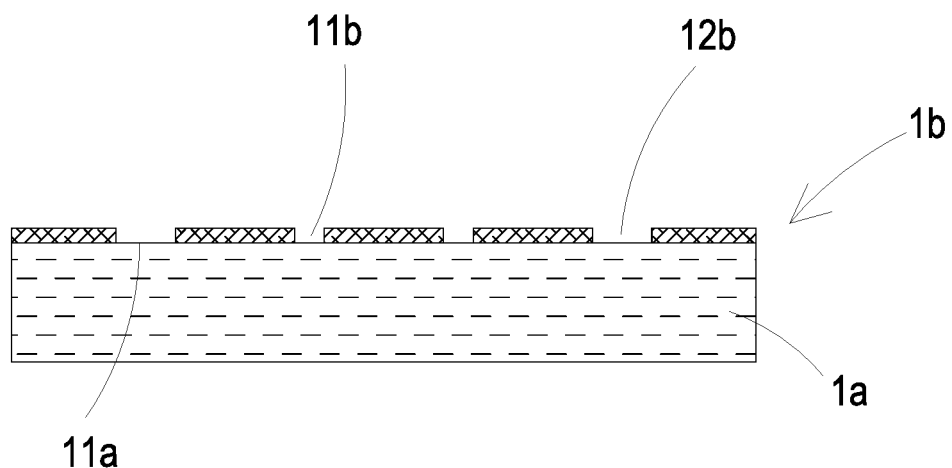

Please refer to FIG. 2 and FIGS. 3A and 3B. In the embodiment, at the step S2, a first insulation layer 1b is formed by depositing and etching. Preferably but not exclusively, the first insulation layer 1b is formed on the first surface 11a of the substrate 1a by depositing a silicon nitride material. In the embodiment, the deposition is at least one selected from the group consisting of physical vapor deposition (PVD), chemical vapor deposition (CVD) and a combination thereof, but the present disclosure is not limited thereto. Furthermore, in the embodiment, at least one first aperture 11b and at least one second aperture 12b are formed on the first insulation layer 1b by micro-lithography and etching. The at least one second aperture 12b surrounds the at least one first aperture 11b. In the embodiment, the etching is at least one selected from the group consisting of wet etching, dry etching and a combination thereof, but the present disclosure is not limited thereto.

Figure 3C:
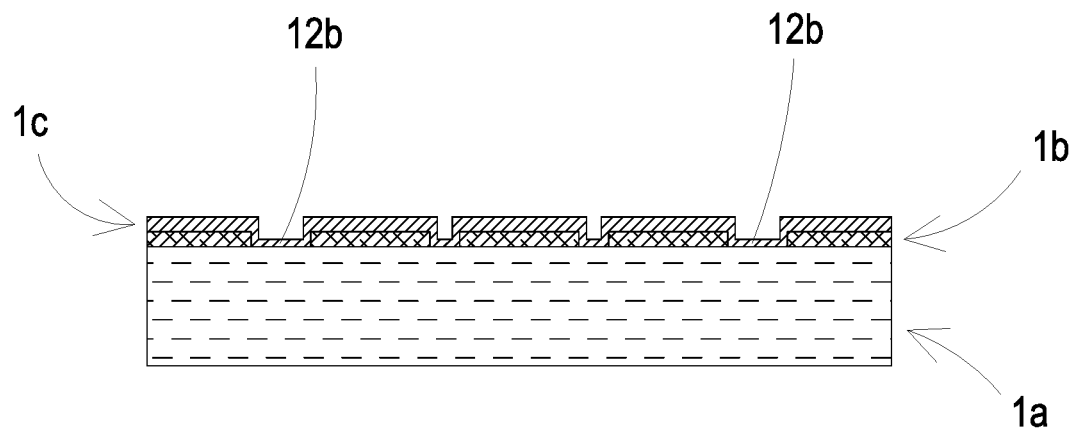
Figure 3D:
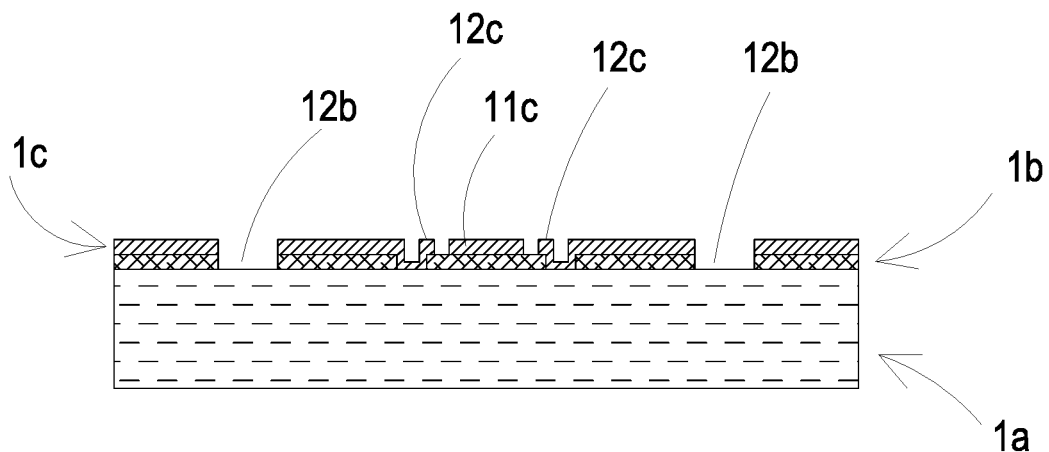
Figure 3E:
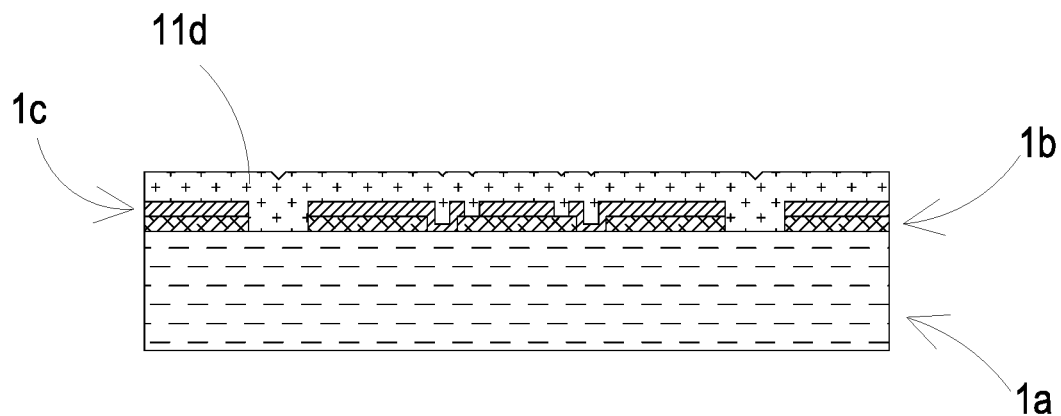

Please refer to FIG. 2 and FIGS. 3C and 3D. In the embodiment, at the step S3, a supporting layer 1c is formed by depositing and etching. Preferably but not exclusively, the supporting layer 1c is formed on the first insulation layer 1b by thin film deposition (as shown in FIG. 3C). Furthermore, a protruding part 11c and a conductive part 12c are formed by micro-lithography and etching. The conductive part 12c surrounds the periphery of the protruding part 11c. In addition, the supporting layer 1c is etched at the part corresponding to the at least one second aperture 12b by micro-lithography and etching, so as to define and completely expose the at least one second aperture 12b (as shown in FIG. 3D).

Figure 3F:
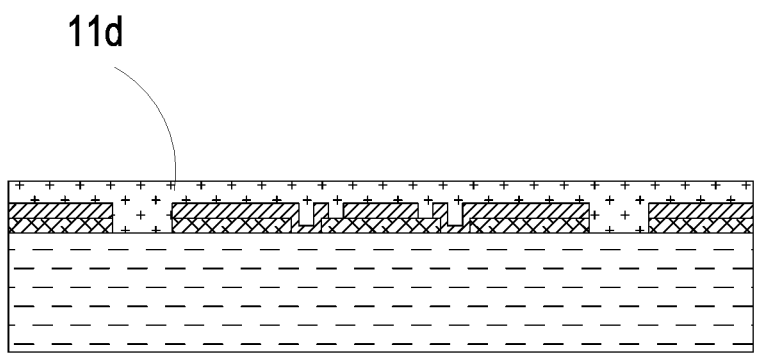
Figure 3G:
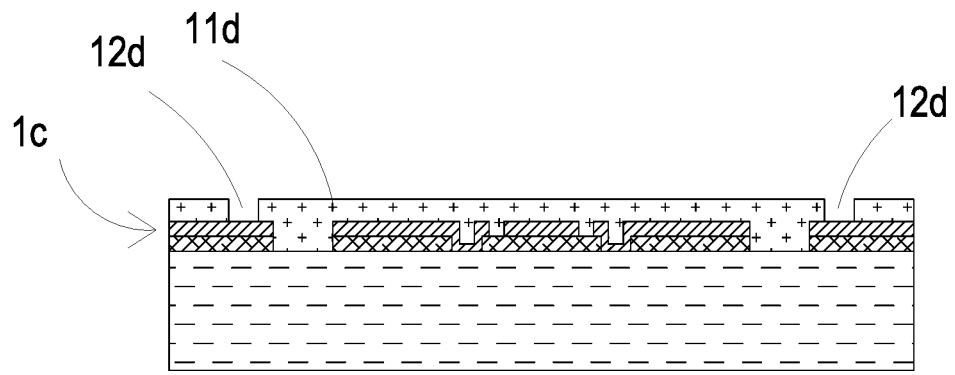
Figure 3H:
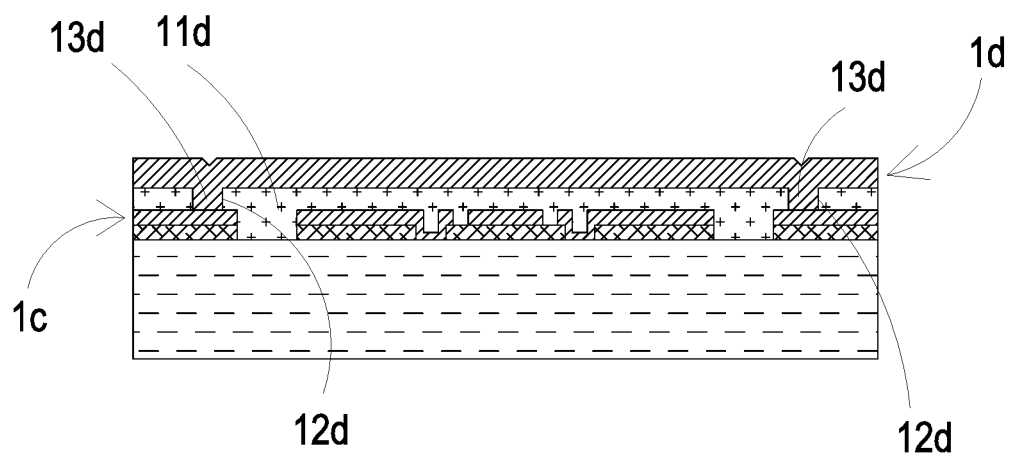
Figure 3I:
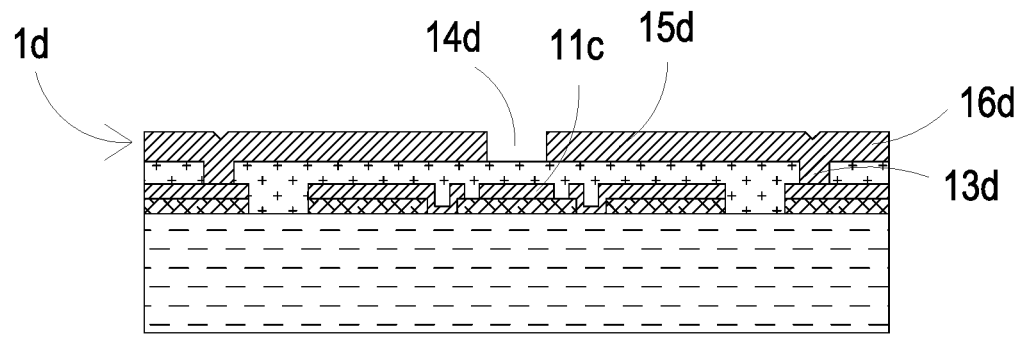
Figure 3J:
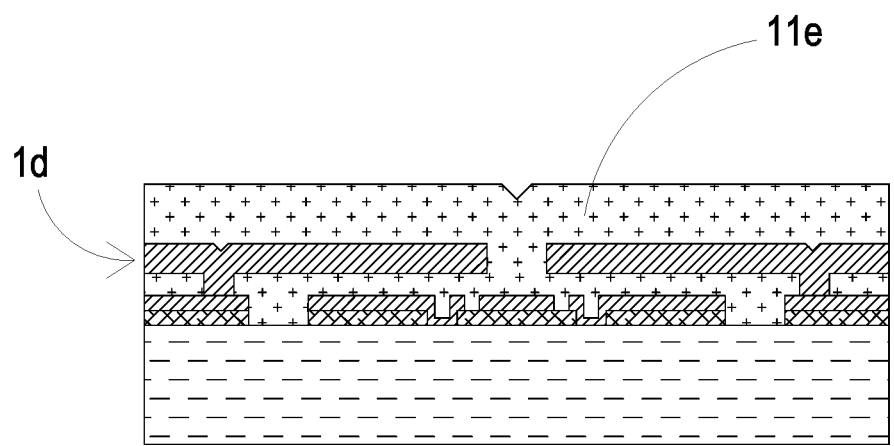

Please refer to FIG. 2 and FIGS. 3E to 3I. In the embodiment, at the step S4, a valve layer 1d is formed by depositing and etching. Preferably but not exclusively, the valve layer 1d is formed by depositing a first oxide layer 11d on the supporting layer 1c, performing planarization (as shown in FIG. 3F), etching a first anchor zone 12d (as shown in FIG. 3G), and then depositing a polysilicon material on the first oxide layer 11d to form the valve layer 1d. Preferably but not exclusively, the polysilicon material is heavily doped to be conductive and commonly used as a gate electrode of a metal oxide semiconductor, which is capable of transmitting the signals at appropriate frequency. Preferably but not exclusively, in the embodiment, the planarization is performed by chemical-mechanical planarization (CMP), spin-on-glass (SOG) or reflow method, so as to eliminate step coverage on the first oxide layer 11d. It facilitates to perform photoresist coating and exposure on the first oxide layer 11d and benefits that the depositing materials is formed perfectly flat on the first oxide layer 11d. The etching depth of the first anchor zone 12d reaches the surface of the supporting layer 1c. Thus, when the valve layer 1d is formed, there is a base part 13d formed on the first anchor zone 12d and the valve layer 1d is connected with and position at the supporting layer 1c through the base part 13d. In the embodiment, the first oxide layer 11d is made by a silicon oxide material, and has a thickness ranged from 1 micrometer (μm) to 5 micrometers (μm). In other embodiment, the first oxide layer 11d is made by a phosphosilicate glass (PSG) material or a borophosphosilicate glass (BPSG) material, but the present disclosure is not limited thereto. Please refer to FIG. 3I again. In the embodiment, the valve layer 1d is etched at the position corresponding to the protruding part 11c of the supporting layer 1c by micro-lithography and etching, so as to form a hollow aperture 14d. Thus, the valve layer 1d is configured to define a movable part 15d and a fixed part 16d. The movable part 15d is arranged from the periphery of the hollow aperture 14d and extended to the base part 13d, and the fixed part 16d is ranged from a portion extended outwardly from the base part 13d of the valve layer 1d.

Figure 3K:
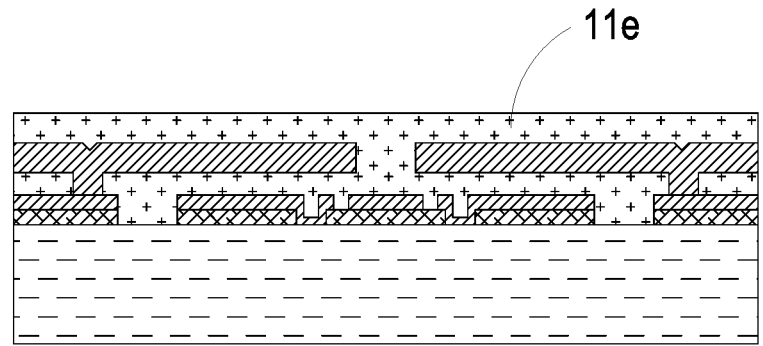
Figure 3L:
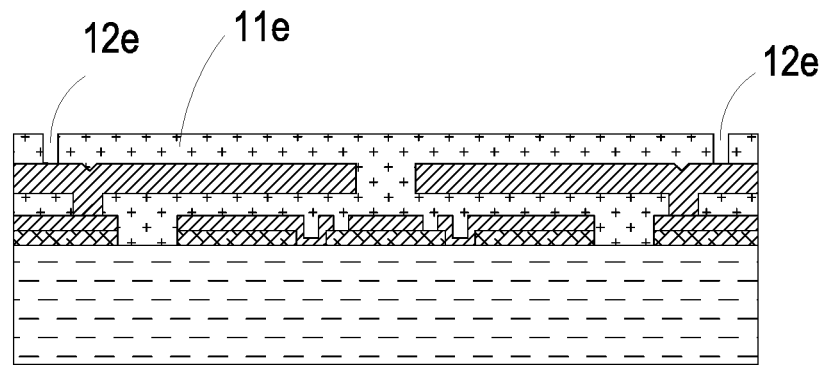
Figure 3M:
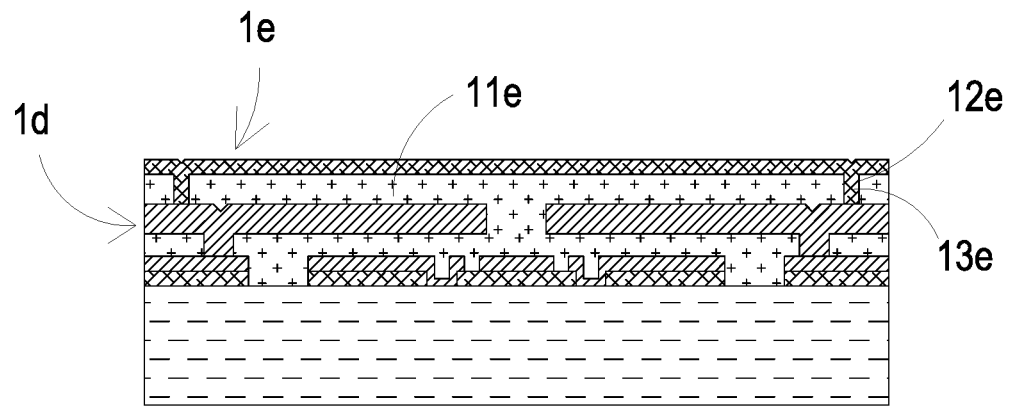
Figure 3N:
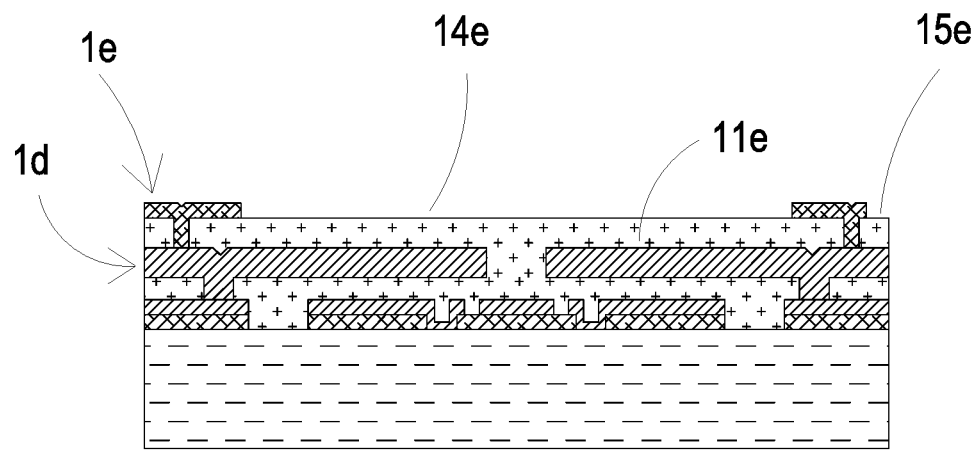

Please refer to FIG. 2 and FIGS. 3J to 3N. In the embodiment, at the step S5, a second insulation layer 1e is formed by depositing and etching. Preferably but not exclusively, the second insulation layer 1e is formed by depositing a second oxide layer 11e on the valve layer 1d firstly, performing planarization (as shown in FIG. 3K), etching a second anchor zone 12e (as shown in FIG. 3L), and then depositing a silicon nitride material on the second oxide layer 11e to form the second insulation layer 1e. Preferably but not exclusively, in the embodiment, the planarization is performed by chemical-mechanical planarization (CMP), spin-on-glass (SOG) or reflow method, so as to eliminate step coverage on the second oxide layer 11e. It facilitates to perform photoresist coating and exposure on the second oxide layer 11e and benefits that the depositing materials is formed perfectly flat on the second oxide layer 11e. The etching depth of the second anchor zone 12e reaches the surface of the valve layer 1d. Thus, when the second insulation layer 1e is formed, there is a supporting part 13e is formed on the second anchor zone 12e, and the second insulation layer 1e is connected with and positioned at the valve layer 1d through the supporting part 13e. In the embodiment, the second oxide layer 11e is made by a silicon oxide material, and has a thickness ranged from 1 micrometer (μm) to 5 micrometers (μm). In other embodiment, the second oxide layer 11e is made by a phosphosilicate glass (PSG) material or a borophosphosilicate glass (BPSG) material, but the present disclosure is not limited thereto. Please refer to FIG. 3N again. In the embodiment, a vibration zone 14e and a bonding-pad zone 15e are formed by performing micro-lithography and etching on the second insulation layer 1e, and the etching depths thereof are reaching the second oxide layer 11e.

Figure 3O:
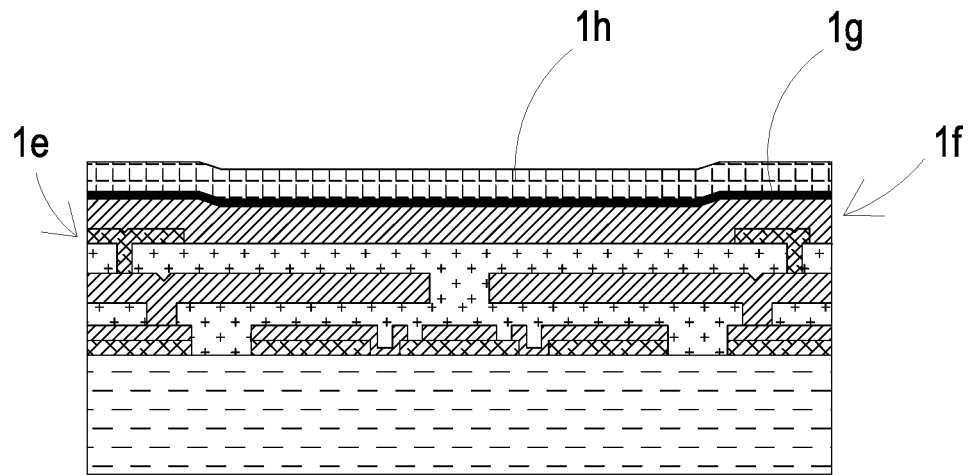
Figure 3P:
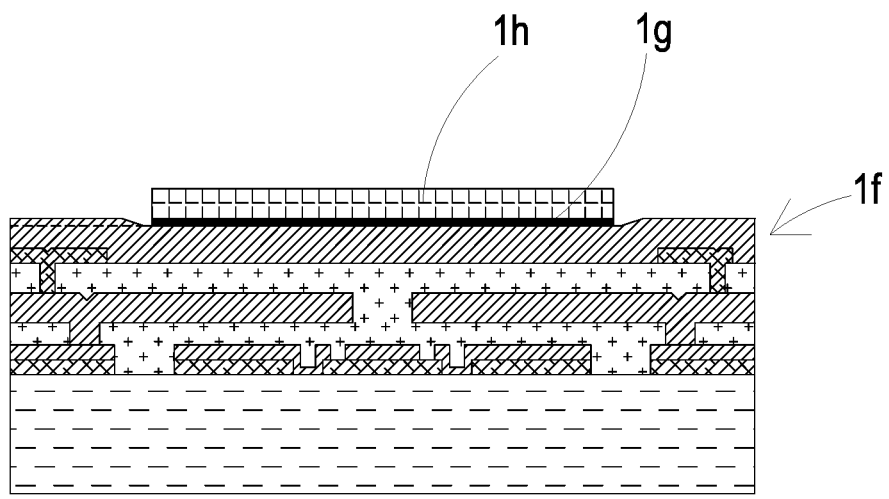

Please refer to FIG. 2 and FIGS. 3O to 3P. In the embodiment, at the step S6, a vibration layer 1f, a lower electrode layer 1g and a piezoelectric actuation layer 1h are formed sequentially by depositing and etching. Preferably but not exclusively, the vibration layer 1f is formed on the second insulation layer 1e by depositing a polysilicon material. The lower electrode layer 1g is formed on the vibration layer 1f by depositing a metallic material. The piezoelectric actuation layer 1h is formed on the lower electrode layer 1g by depositing a piezoelectric material (as shown in FIG. 3O). Preferably but not exclusively, the polysilicon material is heavily doped to be conductive and commonly used as a gate electrode of a metal oxide semiconductor, which is capable of transmitting the signals at appropriate frequency. In the embodiment, the vibration layer 1f has a thickness ranged from 1 micrometer (μm) to 5 micrometers (μm). In other embodiment, the piezoelectric actuation layer 1h can also be produced by a sol-gel process, but the present disclosure is not limited thereto. Referring to FIG. 3P, in the embodiment, the periphery of the lower electrode layer 1g and the piezoelectric actuation layer 1h are etched by micro-lithography and etching, so as to define the piezoelectric actuation layer 1h to be a driving body, define the lower electrode layer 1g to be an electrode and define the desired dimensions of the lower electrode layer 1g and the piezoelectric actuation layer 1h.

Figure 3Q:
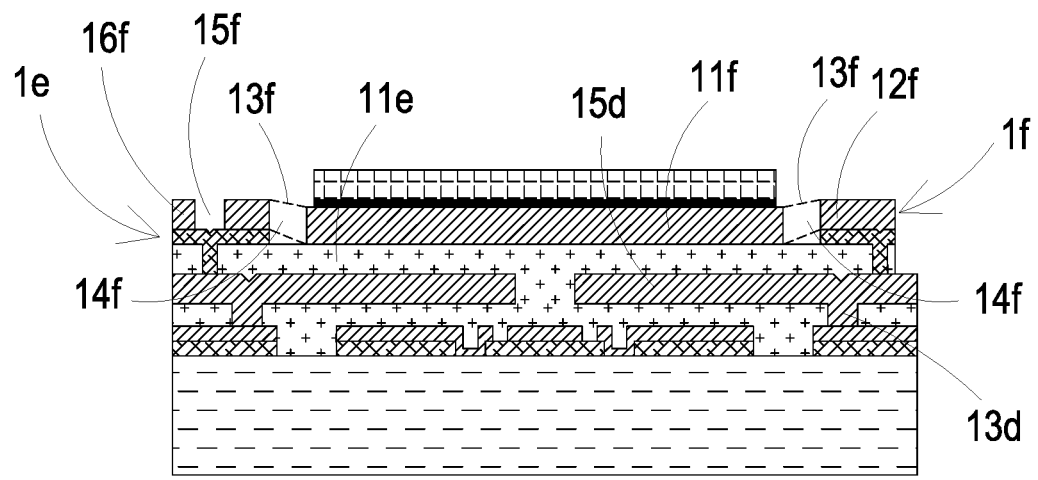
Figure 4A:
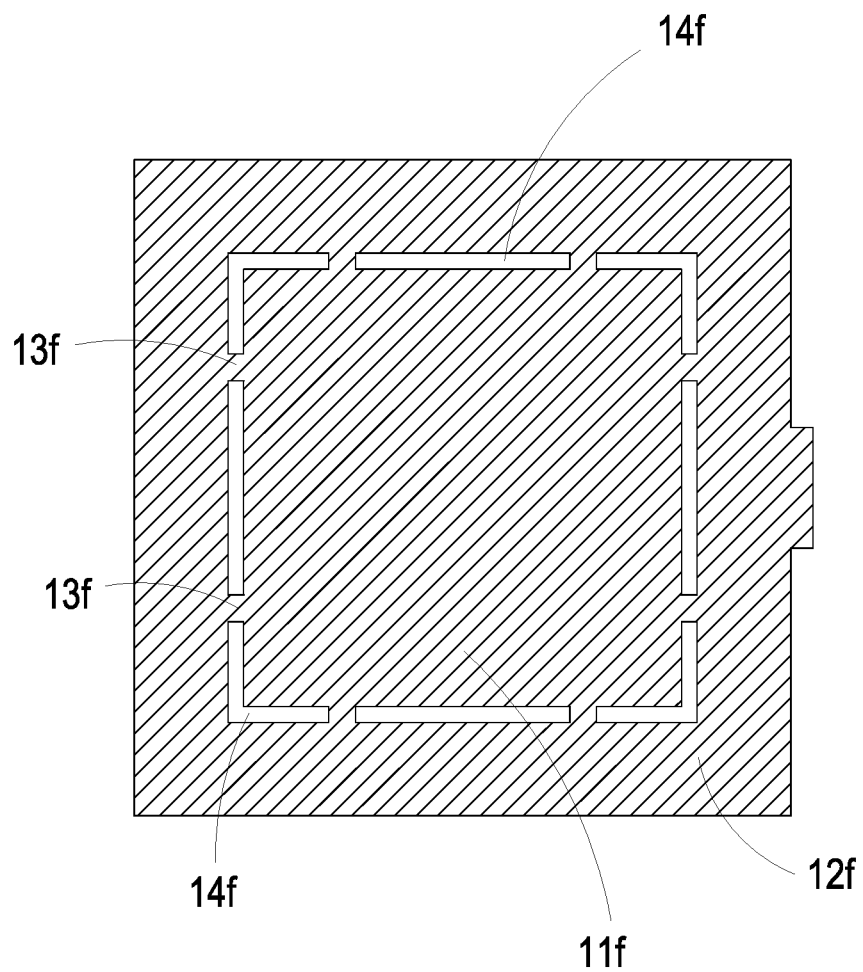
FIG. 4A is a top view illustrating a vibration layer of the micro channel structure according to an embodiment of the present disclosure.
Figure 4B:
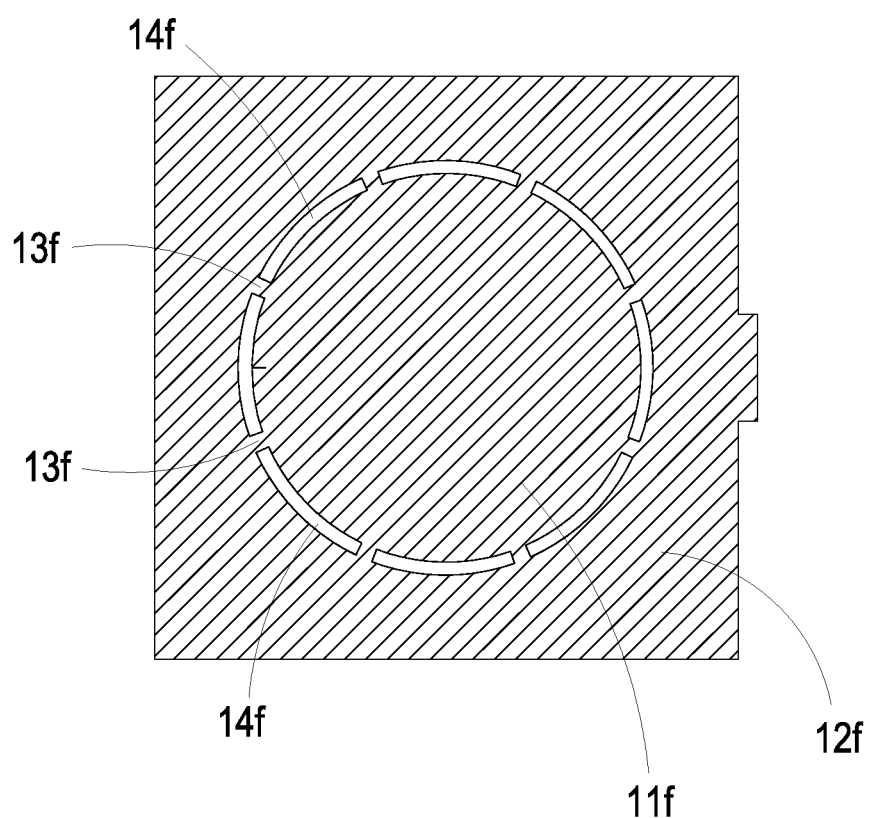
FIG. 4B is a top view illustrating a vibration layer of the micro channel structure according to another embodiment of the present disclosure.

Please refer to FIG. 3Q and FIGS. 4A and 4B. In the embodiment, the vibration layer 1f is etched by micro-lithography and etching to form a suspension part 11f, an outer frame 12f and at least one connection part 13f. At least one vacant space 14f is formed among the suspension part 11f, the outer frame 12f and the at least one connection part 13f. In the embodiment, the etching depth of the at least one vacant space 14f of the vibration layer 1f reaches the surface of the second surface of the second oxide layer 11e. In the embodiment, the at least one connection part 13f is formed between the suspension part 11f and the outer frame 12f. The number of the connection parts 13f may be eight. The connection parts 13f are utilized to provide a supporting force to elastically support the suspension part 11f, but the present disclosure is not limited thereto. In is noted that, in the embodiment, the suspension part 11f is in a square shape (as shown in FIG. 4A), but the present disclosure is not limited thereto. In other embodiment, the shape of the suspension part 11f is adjustable according to the practical requirements, for example, in a circular shape (as shown in FIG. 4B). It should be noted that, in the embodiment, the vibration layer 1f is further etched at the lateral side of the vibration layer 1f by micro-lithography and etching, so as to define a third anchor zone 15f and a bonding-pad part 16E The etching depth of the third anchor zone 15f reaches the surface of the second insulation layer 1e. Consequently, the bonding-pad part 16f is spaced apart and free of electrical connection with the suspension part 11f, the outer frame 12f and the at least one connection part 13f of the vibration layer 1f.

Figure 3R:
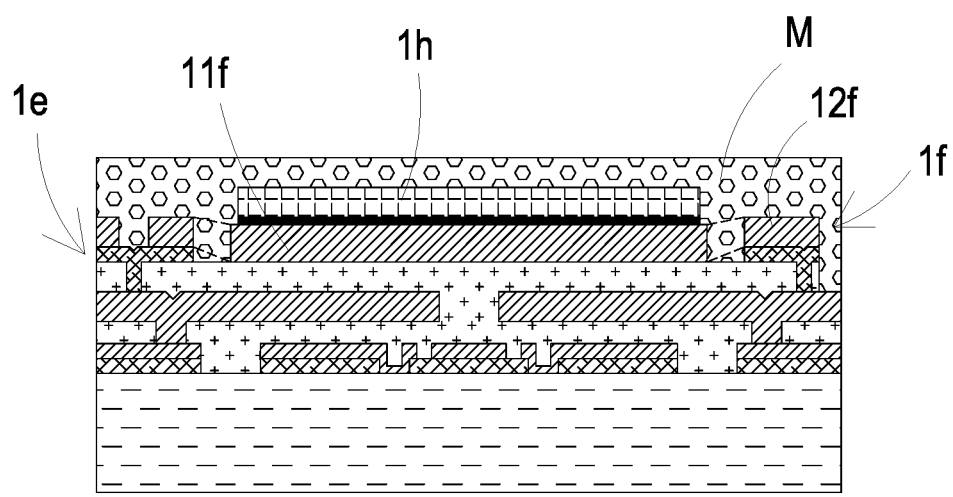
Figure 3S:
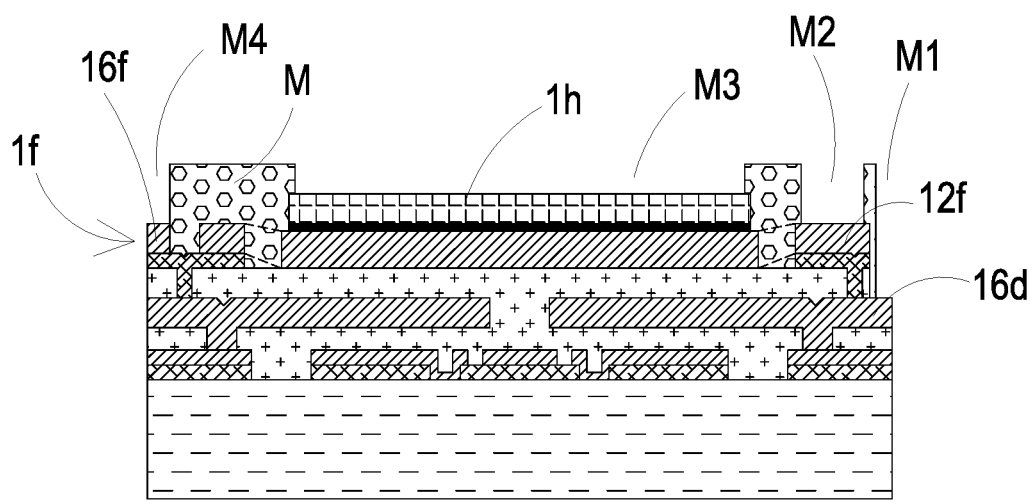

Please refer to FIG. 2 and FIGS. 3R and 3S. In the embodiment, at the step S7, a photoresist layer M is provided to deposit and etch a plurality of bonding pads. Preferably but not exclusively, the photoresist layer M is formed on the piezoelectric actuation layer 1h and the vibration layer if. Then, the photoresist layer M is etched by micro-lithography and etching to form a plurality of recess zones M1, M2, M3, and M4. The etching depth of the recessed zone M1 reaches the surface of the fixed part 16d of the valve layer 1d. The etching depth of the recess zone M2 reaches the surface of the outer frame 12f of the vibration layer 1f. The etching depth of the recess zone M3 reaches the surface of the piezoelectric actuator layer 1h. The etching depth of the recess zone M4 reaches the surface of the bonding-pad part portion 16E In the embodiment of the present disclosure, the photoresist layer M is a negative photoresist, but the present disclosure is not limited thereto.

Figure 3T:
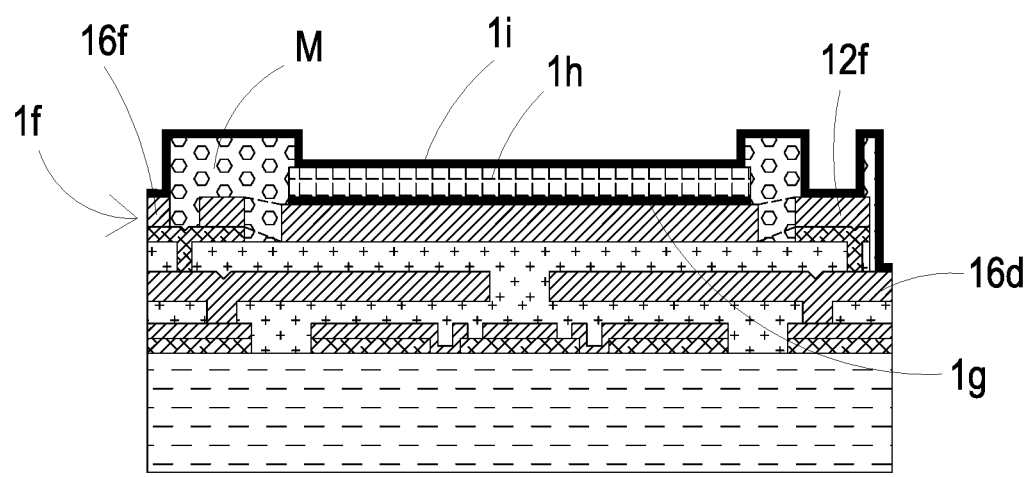
Figure 3U:
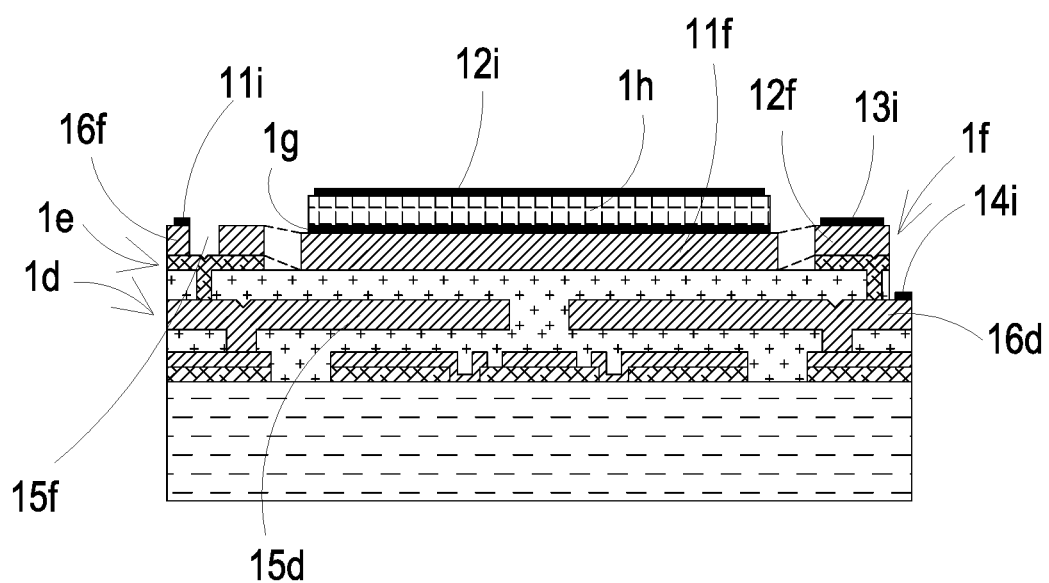

Please refer to FIG. 2 and FIGS. 3T to 3U. In the embodiment, a metallic material is disposed on the fixed part 16d of the valve layer 1d, the outer frame 12f of the vibration layer 1f, the piezoelectric actuation layer 1h, the bonding-pad part 16f and a part of the photoresist M so as to form a bonding-pad layer 1i thereon. Referring to FIG. 3U, in the embodiment, the photoresist M is removed by a lift-off process, so that a reference electrode bonding pad 11i, an upper electrode bonding pad 12i, a lower electrode bonding pad 13i and a valve-layer electrode bonding pad 14i are formed on the bonding-pad layer 1i. The valve-layer electrode bonding pad 14i is formed on the fixed part 16d of the valve layer 1d. The lower electrode bonding pad 13i is formed on a lateral side of the outer frame 12f of the vibration layer 1f and adjacent to the valve-layer electrode bonding pad 14i. The upper electrode bonding pad 12i is formed on the piezoelectric actuation layer 1h. Moreover, the reference electrode bonding pad 11i is formed on the bonding-pad part 16f of the vibration layer 1f. In that, the piezoelectric actuation layer 1h is formed between the upper electrode bonding pad 12i and the lower electrode layer 1g, and the lower electrode bonding pad 13i is in electrical connection with the lower electrode layer 1g through the vibration layer 1f. It is noted that the third anchor zone 15f is disposed to make the reference electrode bonding pad 11i be isolated through the second insulation layer 1e and free of electrical connection with the lower electrode layer 1g and the lower electrode bonding pad 13i. In the above embodiment, the arrangements of the reference electrode bonding pad 11i, the upper electrode bonding pad 12i, the lower electrode bonding pad 13i and the valve-layer electrode bonding pad 14i of the bonding-pad layer 1i and the structure of the relative layers are adjustable according to the practical requirements. It shows the feasibility of bonding merely, but the present disclosure is not limited thereto.

Figure 3V:
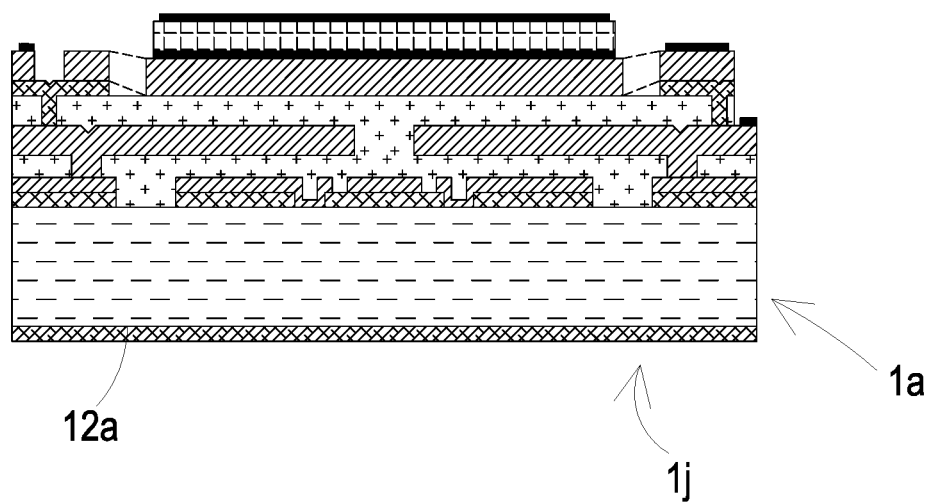
Figure 3W:
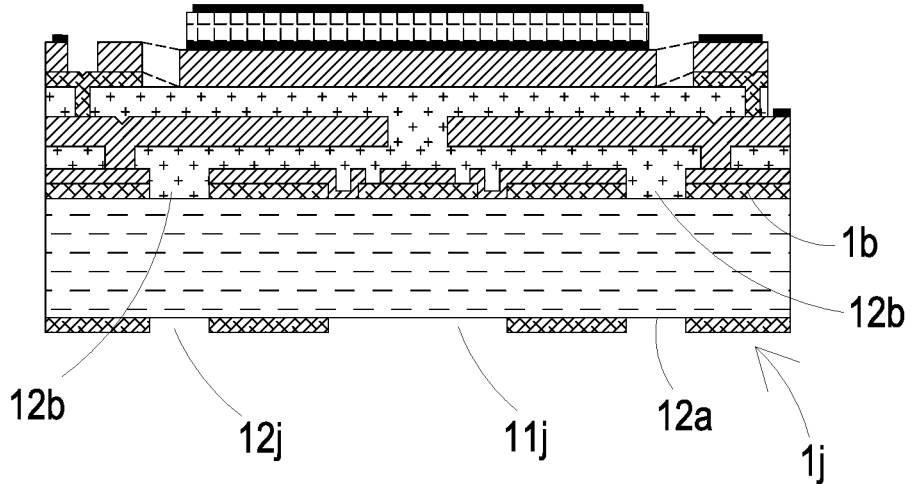

Please refer to FIG. 2 and FIGS. 3V and 3W. In the embodiment, at the step S8, a mask layer 1j is formed by depositing and etching. Preferably but not exclusively, the mask layer 1j is formed on the second surface 12a of the substrate 1a by depositing a silicon oxide material, and the mask layer 1j is etched by micro-lithography and etching to form a conductive zone 11j and at least one flow channel zone 12j. The at least one flow channel zone 12j of the mask layer 1j is spatially corresponding to the position of the at least one second aperture 12b of the first insulation layer 1b. In addition, the etching depths of the conductive zone 11j and the at least one flow channel zone 12j are reaching the second surface 12a of the substrate 1a.

Figure 3X:
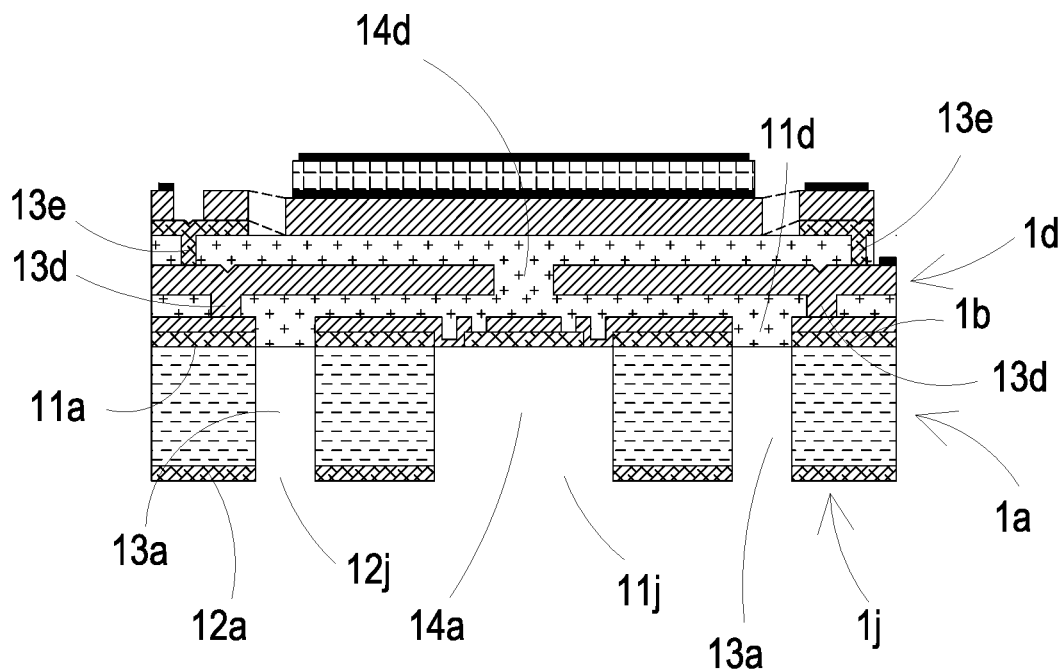
Figure 3Y:
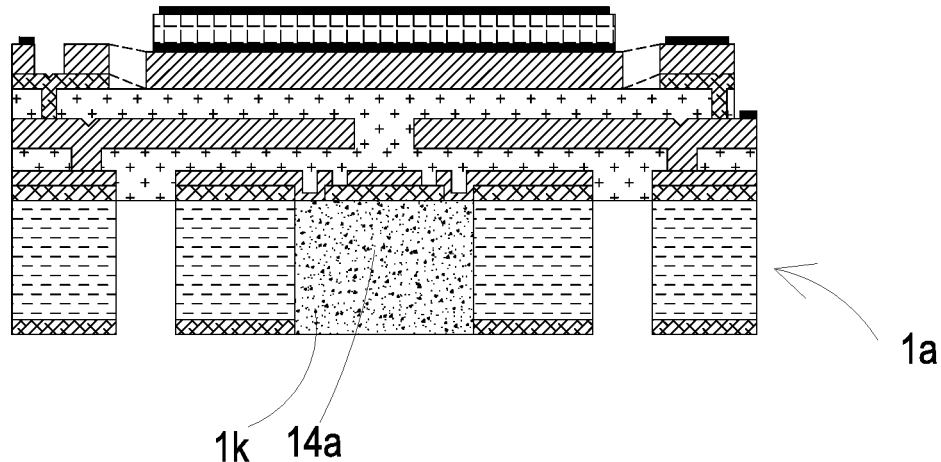
Figure 4C:
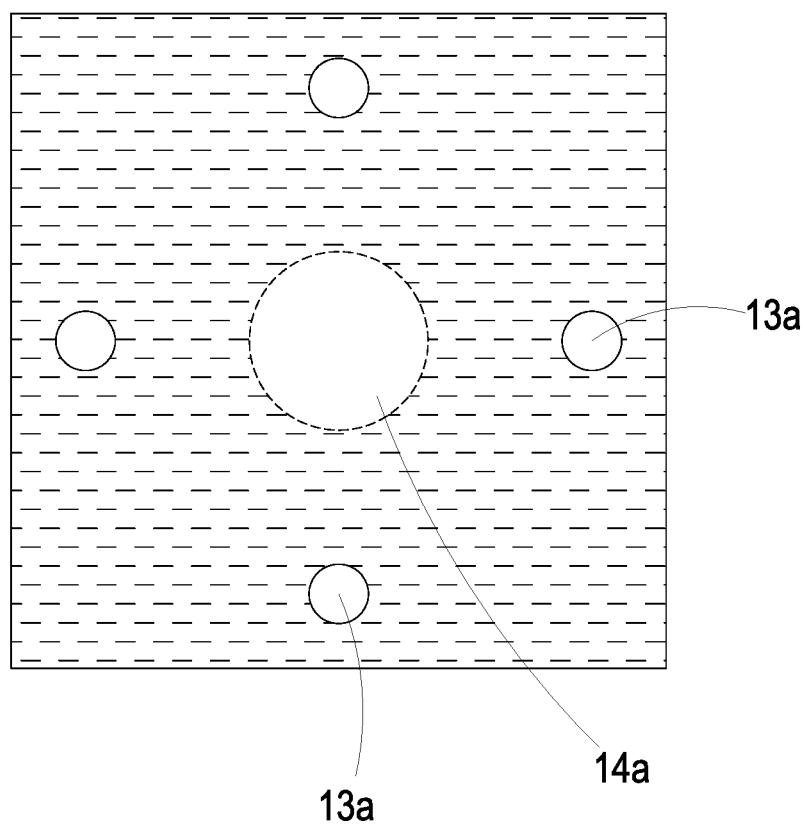
FIG. 4C is a top view illustrating a substrate of the micro channel structure according to an embodiment of the present disclosure.

Please to FIGS. 3X and 4C. In the embodiment, the micro-lithography and etching is further performed to cut through the conductive zone 11j and the at least one flow channel zone 12j of the mask layer 1j, and the etching depths thereof starts from the second surface 12a until reaching the first insulation layer 1b. Thus, the substrate 1a is etched to define the at least one flow channel 13a and a receiving slot 14a. In that, the at least one flow channel 13a is spatially corresponding to the position of the at least one second aperture 12b of the first insulation layer 1b. In the embodiment, the number of the flow channels 13a is four, but the present disclosure is not limited thereto. In the embodiment, the four flow channels 13a are disposed to surround the receiving slot 14a at an equiangular distance (as shown in FIG. 4C), but the present disclosure is not limited thereto. In the embodiment, the receiving slot 14a may be circle-shaped, but not limited thereto. Please refer to FIG. 3Y In the embodiment, a base electrode bonding pad 1k is formed by filling a polymer conductive material into the receiving slot 14a of the substrate 1a, so that the base electrode bonding pad 1k and the conductive part 12c of the supporting layer 1c are in electrical connection with each other. It is noted that, in other embodiments, the base electrode bonding pad 1k can be made of any conductive material or made by a microelectroforming method, but the present disclosure is not limited thereto. The position of the base electrode bonding pad 1k is adjustable according to the practical requirements.

Figure 3Z:
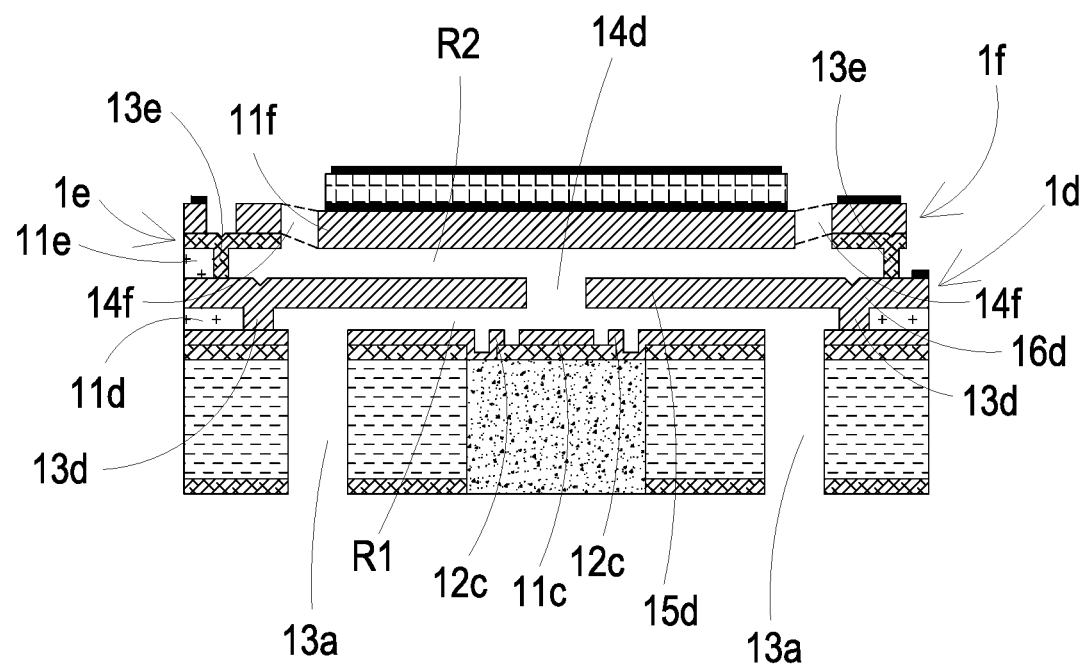

Please refer to FIG. 2 and FIG. 3Z. In the embodiment, at the step S9, the micro-lithography and etching is further performed to form a first chamber R1. By the micro-lithography and etching, the first oxide layer 11d surrounded by the base part 13d of the valve layer 1d is released and removed to form a first chamber R1. More specifically, the etching liquid is poured through the at least one flow channel 13a of the substrate 1a to etch the first oxide layer 11d surrounded by the base part 13d of the valve layer 1d and thereby forms the first chamber R1.

In the embodiment, at the step S10, the micro-lithography and etching is further performed to form a second chamber R2. By the micro-lithography and etching, the second oxide layer 11e surrounded by the supporting part 13e of the second insulation layer 1e is released and removed to form a second chamber R2. More specifically, the etching liquid is poured through the at least one vacant space 14f to etch the second oxide layer 11e surrounded by the supporting part 13e of the second insulation layer 1e. As a result, the second oxide layer 11e is released and removed, and the second chamber R2 is formed. Meanwhile, the second oxide layer 11e located at the hollow aperture 14d is also released and removed. Consequently, the hollow aperture 14d is in fluid communication between the first chamber R1 and the second chamber R2, and the first chamber R1 is in fluid communication with the at least one flow channel 13a of the substrate 1a.

In the embodiment, the first chamber R1 has a depth from the movable part 15d of the valve layer 1d to the supporting layer 1c. Preferably but not exclusively, the depth of the first chamber R1 is ranged from 1 micrometer (μm) to 5 micrometers (μm). In addition, the second chamber R2 has a depth from the movable part 15d of the valve layer 1d to the suspension part 11f of the vibration layer 1f. Preferably but not exclusively, the depth of the second chamber R2 is ranged from 1 micrometer (μm) to 5 micrometers (μm). Furthermore, it should be noted that the micro channel structure 1 of the present disclosure has the base part 13d in the valve layer 1d and the supporting part 13e in the second insulation layer 1e, so as to limit the oxide etching region of the first oxide layer 11d and the second oxide layer 11e. In the lift-off process for removing the photoresist layer M, since the micro-channel structure 1 is a miniaturized structure having few and small apertures, the etching time is forced to be elongated. By the barrier of the base part 13d of the valve layer 1d and the supporting part 13e of the second insulation layer 1e, the side etching of the first chamber R1 and the second chamber R2 can be avoided to form the first chamber R1 and the second chamber R2 with stable dimension. It achieves extremely progressive benefits.

According to the above description, it can be understood that the micro channel structure 1 includes the mask layer 1j, the substrate 1a, the first insulation layer 1b, the supporting layer 1c, the valve layer 1d, the second insulation layer 1e, the vibration layer 1f, and the lower electrode layer. 1g, the piezoelectric actuation layer 1h and the bonding-pad layer 1i sequentially stacked and combined to form an integrated miniaturized structure. Thereafter, the actions of the micro channel structure 1 will be described in detail as follows.

Figure 5A:
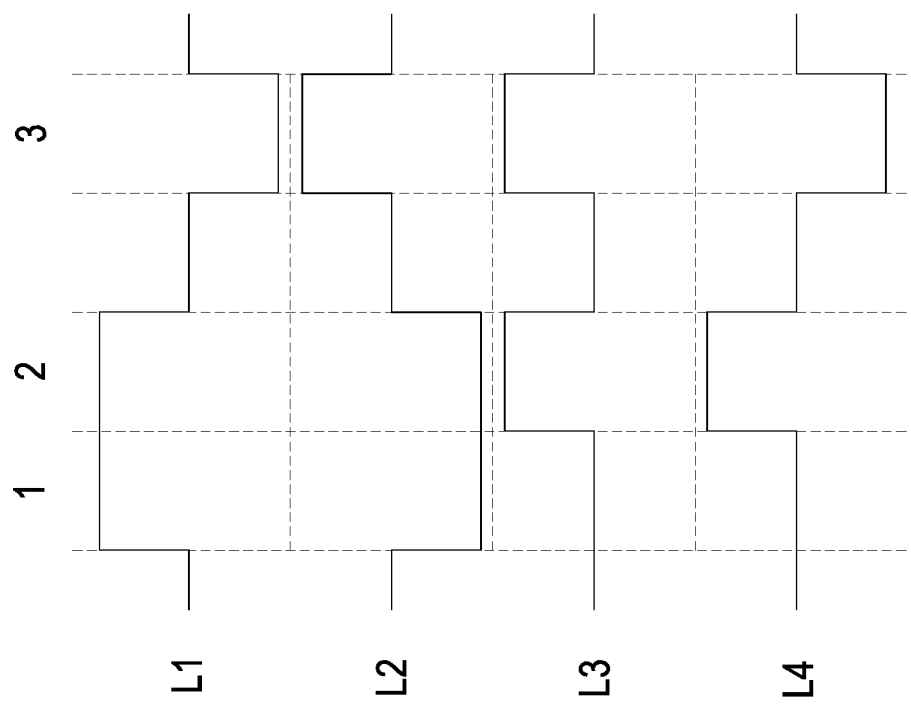
FIG. 5A is a schematic diagram showing driving power sources having different phases to drive the micro channel structure of the present disclosure.

Please refer to FIG. 1 and FIG. 5A. In the embodiment, the upper electrode bonding pad 12i is connected to a circuit (not shown), which can be made for example by conventional wire bonding, so as to form a first loop circuit L1. The lower electrode bonding pad 13i is connected to a circuit (not shown), which can be made for example by conventional wire bonding, so as to form a second loop circuit L2. The valve-layer electrode bonding pad 14i and the reference electrode bonding pad 11i are connected to a circuit (not shown), which can be made for example by conventional wire bonding, so as to form a third loop circuit L3. The base electrode bonding pad 1k and the reference electrode bonding pad 11i are connected to a circuit (not shown), which can be made for example by conventional wire bonding, so as to form a fourth loop circuit L4. In the embodiment, driving power sources having different phases are provided to the first loop circuit L1, the second loop circuit L2, the third loop circuit L3 and the fourth loop circuit L4. By utilizing the principle of likes repeal and opposites attract, the suspension part 11f of the vibration layer 1f, the movable part 15d of the valve layer 1d and the substrate 1a are controlled to move relatively, so as to achieve fluid transportation. It is noted that the depths of the first chamber R1 and the second chamber R2 are extremely small, thereby increasing the electrostatic force between the substrate 1a, the valve layer 1d and the vibration layer 1f. Thus, the micro channel structure 1 not only reliably controls the resonance frequency of the valve layer 1d and the vibration layer 1f to transport the fluid, but also operates in accordance with the electric charges of the substrate 1a and the valve layer 1d. It facilitates to achieve the feasibility and transportation efficiency of the miniaturized micro channel structure 1.

Figure 5B:
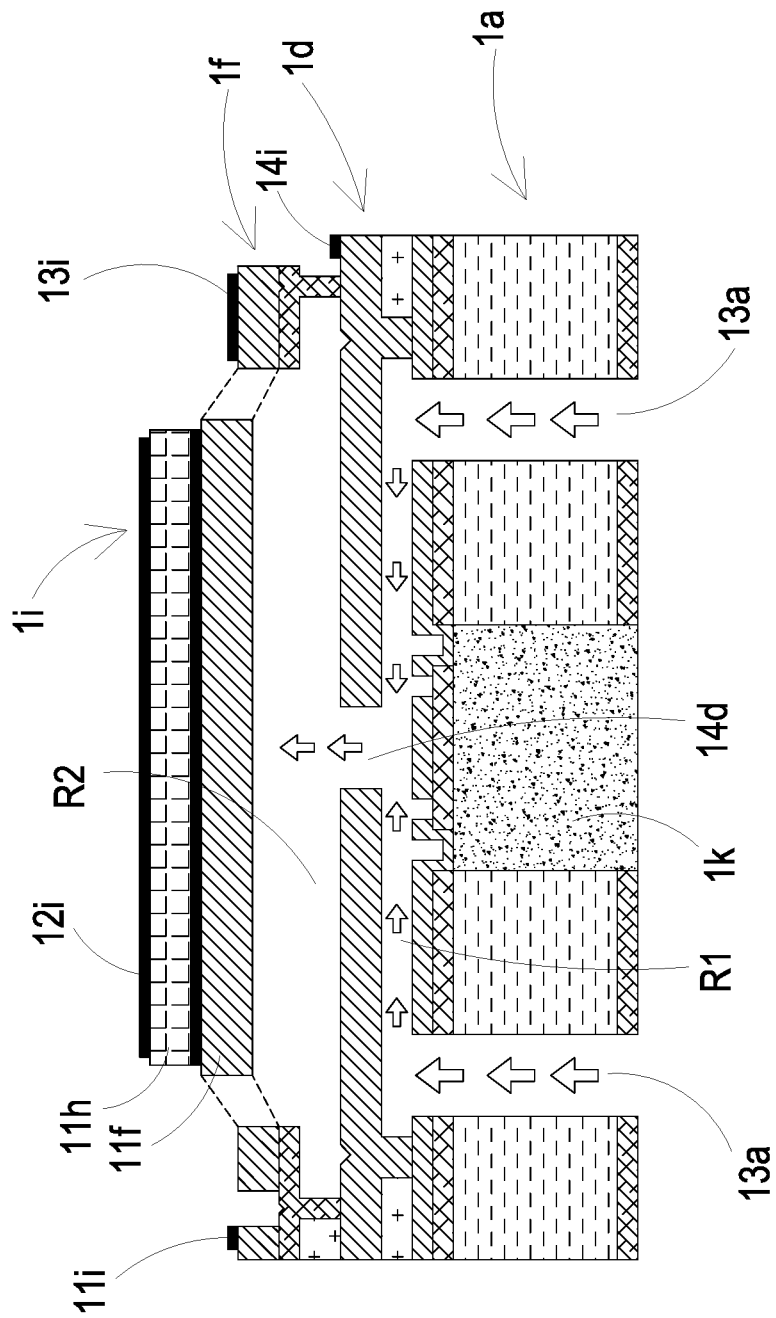
Figure 5D:
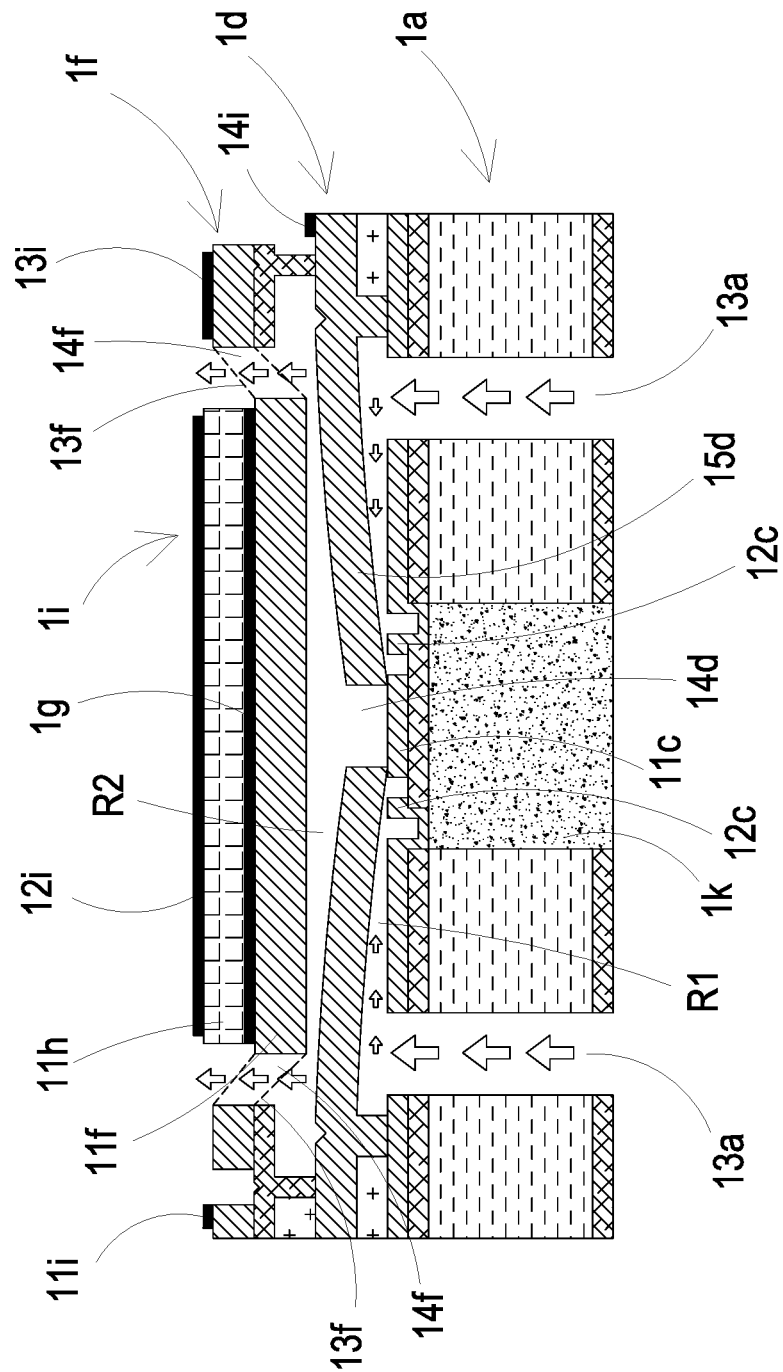

Please refer to FIGS. 5A and 5B. In the embodiment, the actions of the micro channel structure 1 are described as follows. In a first stage, a positive voltage is applied to the first loop circuit L1 and a negative voltage is applied to the second loop circuit L2. Consequently, the piezoelectric actuation layer 1h drives the suspension part 11f of the vibration layer 1f to displace in a direction away from the substrate 1a. Thus, fluid (e.g., gas or liquid) is inhaled from the exterior into the micro channel structure 1 through the at least one flow channel 13a. The fluid inhaled into the micro channel structure 1 flows through the first chamber R1 and the hollow aperture 14d sequentially, and is converged in the second chamber R2. Please refer to FIGS. 5A and 5C. In a second stage, a positive voltage is applied to the third loop circuit L3 and the fourth loop circuit L4 to make the movable part 15d of the valve layer 1d and the conductive part 12c of the supporting layer 1c have identical charges, so that the movable part 15d and the conductive part 12c are repelled with each other to move. Namely, the moveable part 15d of the valve layer 1d is displaced in the direction away from the substrate 1a. As shown in FIG. 5C, the suspension part 11f of the vibration layer 1f and the movable part 15d of the valve layer 1d are both displaced upwardly. Thus, the fluid is inhaled from the exterior into the micro channel structure 1 through the at least one flow channel 13a continuously, and the fluid converged in the second chamber R2 is compressed to flow toward the periphery of the second chamber R2. Please refer to FIGS. 5A and 5D. In the third stage, the electrical properties of the first loop circuit L1, the second loop circuit L2, the third loop circuit L3 and the fourth loop circuit L4 are changed respectively. A negative voltage is applied to the first loop circuit L1 and a positive voltage is applied to the second loop circuit L2. Consequently, the suspension part 11f of the vibration layer 1f is displaced in a direction toward the substrate 1a. At the same time, a positive voltage is applied to the third loop circuit L3 and a negative voltage is applied to the fourth loop circuit L4 to make the movable part 15d of the valve layer 1d and the conductive part 12c of the supporting layer 1c have opposite charges. Consequently, the movable part 15d of the valve layer 1d and the conductive part 12c of the supporting layer 1c having opposite charges are attracted with each other to move. Namely, the moveable part 15d of the valve layer 1d is displaced in the direction toward the substrate 1a. As shown in FIG. 5D, the suspension part 11f of the vibration layer 1f and the movable part 15d of the valve layer 1d are displaced downwardly. Thus, the movable part 15d of the valve layer 1d is attracted by the conductive part 12c and abuts against the protruding part 11c of the supporting layer 1c. The hollow aperture 14d of the valve layer 1d is closed by the protruding part 11c, the fluid inhaled into the interior of the micro channel structure 1 fails to enter the second chamber R2, and the volume of the second chamber R2 is compressed by the suspension part 11f of the vibration layer 1f, so that the fluid converged in the second chamber R2 is discharged out of the micro channel structure 1 through the at least one vacant space 14f to achieve fluid transportation of the micro channel structure 1. The actions for transporting fluid by the micro channel structure 1 are described as the above. Repeating the above described actions of FIGS. 5B to 5D, the micro channel structure 1 can continuously transport the fluid at high speed, achieving the operation of the micro channel structure 1 which continuously transports the fluid.

It should be noted that the structure and the operation of the micro channel structure 1 of the present disclosure can be understood according to the above descriptions. In the embodiment, with the arrangement of the protruding part 11c of the supporting layer 1c, when the movable part 15d of the valve layer 1d is displaced in the direction toward the substrate 1a, the movable part 15d abuts against the protruding part 11c of the supporting layer 1c, thereby ensuring the hollow aperture 14d not in fluid communication with the first chamber R1 and the at least one flow channel 13a. In that, the first chamber R1 and the second chamber R2 are blocked and not in fluid communication with each other, which facilitates the micro channel structure 1 to be applied for transporting a low-density fluid. In other embodiments, the protruding part 11c of the supporting layer 1c can be omitted to perform the fluid transportation of the micro channel structure 1. Moreover, in the embodiment, the conductive part 12c of the supporting layer 1c surrounds the periphery of the protruding part 11c. As a result, when the movable part 15d of the valve layer 1d and the conductive part 12c having opposite charges are attracted with each other to move, the conductive part 12c is prevented from contacting with the front end of the moveable part 15d, which may cause a short circuit. Moreover, the front end of the movable part 15d can be attached to the protruding part 11c of the support layer 1c easily, which helps to close the hollow aperture 14d of the valve layer 1d. On the other hand, in the embodiment, after the valve layer 1d is planarized, a surface treatment can be further performed. Preferably but not exclusively, the capillary force of the surface can be reduced by applying plasma or polymer material to improve the stiction of the suspension structure, so that the valve layer 1d can be displaced easily between the first chamber R1 and the second chamber R2.

In summary, the present disclosure provides a manufacturing method of a micro channel structure. The micro channel structure is mainly produced by a semiconductor process. By providing driving power sources having different phases to the upper electrode bonding pad, the lower electrode bonding pad, the valve-layer electrode bonding pad and the base electrode bonding pad of the substrate, and utilizing the principle of likes repeal and opposites attract, the suspension part of the vibration layer, the movable part of the valve layer and the substrate are controlled to move relatively, so as to achieve fluid transportation. In this way, the miniaturized micro channel structure can overcome the electrostatic force in the extremely shallow chamber structure, it facilitates to achieve the feasibility of the fluid transportation and the great transporting efficiency in an extremely miniaturized structure. It is extremely valuable for the use of the industry, and it is submitted in accordance with the law.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a micro channel structure comprising steps of:
   (a) providing a substrate, wherein the substrate has a first surface and a second surface opposite to each other;
   (b) depositing and etching to form a first insulation layer, wherein an insulation material is deposited on the first surface of the substrate to form the first insulation layer and etching is performed to form at least one first aperture and at least one second aperture on the first insulation layer, wherein the at least one second aperture is disposed around the at least one first aperture;
   (c) depositing and etching to form a supporting layer, wherein a conductive material is deposited on the first insulation layer to form the supporting layer, and etching is performed to form a protruding part and a conductive part;
   (d) depositing and etching to form a valve layer, wherein an oxide material is deposited on the supporting layer to form a first oxide layer, and etching is performed to form a first anchor zone, after which a conductive material is deposited on the first oxide layer and the first anchor zone to form the valve layer, and the valve layer is etched to form a base part with a height, a movable part, a fixed part, and a hollow aperture;
   (e) depositing and etching to form a second insulation layer, wherein an oxide material is deposited on the valve layer to form a second oxide layer, etching is performed to form a second anchor zone, after which an insulation material is deposited on the second oxide layer and the second anchor zone to form the second insulation layer, and the second insulation layer is etched to form a supporting part with a height;
   (f) depositing and etching to form a vibration layer, a lower electrode layer and a piezoelectric actuation layer, wherein a conductive materials is deposited on the second insulation layer to form the vibration layer, a metallic material is deposited on the vibration layer to form the lower electrode layer, and a piezoelectric material is deposited on the lower electrode layer to form the piezoelectric actuation layer, wherein the lower electrode layer and the piezoelectric actuation layer are etched to have desired dimensions and to form a suspension part, an outer frame, at least one connection part and a bonding-pad part on the vibration layer, wherein at least one vacant space is formed among the suspension part, the outer frame and the at least one connection part;
   (g) providing a photoresist layer to deposit and etch a plurality of bonding pads, wherein a photoresist material is deposited on the piezoelectric actuation layer and the vibration layer to form the photoresist layer, and the photoresist layer is etched to form a plurality of recess zones, wherein the plurality of recess zones are aligned with the position of the fixed part of the valve layer, the position of the outer frame of the vibration layer, the position of the piezoelectric actuation layer and the position of the bonding-pad part, respectively, after which a metallic material is deposited on the plurality of recess zones to form a bonding-pad layer and the bonding-pad layer is etched to form the plurality of bonding pads, wherein the plurality of bonding pads are defined as a reference electrode bonding pad formed on the bonding-pad part of the vibration layer, an upper electrode bonding pad formed on the piezoelectric actuation layer, a lower electrode bonding pad formed on a lateral side of the outer frame of the vibration layer, and a valve-layer electrode bonding pad formed on the fixed part of the valve layer;
   (h) depositing and etching to form a mask layer, wherein a silicon oxide material is deposited on the second surface of the substrate to form the mask layer, after which etching is performed to form at least one flow channel and a receiving slot in the substrate, wherein the at least one flow channel is spatially corresponding to the position of the at least one second aperture of the first insulation layer, and the receiving slot and the conducive part of the supporting layer are in electrical connection with each other, wherein a base electrode bonding pad is formed by filling a polymer conductive material into the receiving slot, so that the base electrode bonding pad and the conducive part of the supporting layer are in electrical connection with each other;

(i) etching to form a first chamber, wherein etching is performed through the at least one flow channel of the substrate to release and remove the first oxide layer surrounded by the base part of the valve layer, so as to form the first chamber surrounded by the base part and make the hollow aperture of the valve layer in fluid communication with the first chamber; and (j) etching to form a second chamber, wherein etching is performed through the at least one vacant space to release and remove the second oxide layer surrounded by the supporting part of the second insulation layer, so as to form the second chamber surrounded by the supporting part and make the second chamber and the first chamber in fluid communication with each other through the hollow aperture.

2. The manufacturing method of the micro channel structure according to claim 1, wherein the oxide material is a silicon oxide material, a phosphosilicate glass (PSG) material or a borophosphosilicate glass (BPSG) material.

3. The manufacturing method of the micro channel structure according to claim 1, wherein the conductive material is a polysilicon material.

4. The manufacturing method of the micro channel structure according to claim 1, wherein the insulation material is a silicon nitride material.

5. The manufacturing method of the micro channel structure according to claim 1, wherein the photoresist material is a negative photoresist material.

6. The manufacturing method of the micro channel structure according to claim 1, wherein the hollow aperture is formed on the valve layer and located at a position corresponding to the protruding part of the supporting layer, wherein the movable part is defined to be arranged form the periphery of the hollow aperture and extended to the base part, and the fixed part is defined to be arranged from a portion extended outwardly from the base part.

7. The manufacturing method of the micro channel structure according to claim 1, wherein the plurality of recess zones are etched to have depths reaching the surface of the fixed part of the valve layer, the surface of the outer frame of the vibration layer, the surface of the piezoelectric actuator layer and the surface of the bonding-pad part, respectively.

8. The manufacturing method of the micro channel structure according to claim 1, wherein the at least one connection part is formed between the suspension part and the outer frame, to provide a supporting force to elastically support the suspension part, and the bonding-pad part is spaced apart and free of electrical connection with the suspension part, the outer frame and the at least one connection part.

9. The manufacturing method of the micro channel structure according to claim 8, wherein
the upper electrode bonding pad is configured to form a first loop circuit;
the lower electrode bonding pad is configured to form a second loop circuit, wherein opposite charges are provided to the first loop circuit and the second loop circuit, respectively, so that the piezoelectric actuation layer drives the suspension part of the vibration layer to move upwardly and downwardly;
the valve-layer electrode bonding pad and the reference electrode bonding pad are configured to form a third loop circuit; and
the base electrode bonding pad and the reference electrode bonding pad are configured to form a fourth loop circuit, wherein identical charges are provided to the third loop circuit and the fourth loop circuit, respectively, thereby generating the relative displacement between the movable part of the valve layer and the conductive part of the supporting layer as a repelling displacement, wherein opposite charges are provided to the third loop circuit and the fourth loop circuit, respectively, thereby generating the relative displacement between the movable part of the valve layer and the conductive part of the supporting layer as an attracting displacement.

10. The manufacturing method of the micro channel structure according to claim 9, wherein a positive voltage is applied to the first loop circuit and a negative voltage is applied to the second loop circuit, so that the piezoelectric actuation layer drives the suspension part of the vibration layer to move in a direction away from the substrate.

11. The manufacturing method of micro channel structure according to claim 9, wherein a negative voltage is applied to the first loop circuit and a positive voltage is applied to the second loop circuit, so that the piezoelectric actuation layer drives the suspension part of the vibration layer to move in a direction toward the substrate.

12. The manufacturing method of micro channel structure according to claim 9, wherein a positive voltage is applied to the third loop circuit and the fourth loop circuit to make the movable part of the valve layer and the conductive part of the supporting layer have identical charges, so that the movable part of the valve layer and the conductive part of the supporting layer having identical charges are repelled with each other to move, making the moveable part of the valve layer move in the direction away from the substrate.

13. The manufacturing method of micro channel structure according to claim 9, wherein a positive voltage is applied to the third loop circuit and a negative voltage is applied to the fourth loop circuit to make the movable part of the valve layer and the conductive part of the supporting layer have opposite charges, so that the movable part of the valve layer and the conductive part of the supporting layer having opposite charges are attracted with each other to move, making the moveable part of the valve layer move in the direction toward the substrate.

14. The manufacturing method of micro channel structure according to claim 9, wherein
a positive voltage is applied to the first loop circuit and a negative voltage is applied to the second loop circuit, so that the piezoelectric actuation layer drives the suspension part of the vibration layer to move in a direction away from the substrate, thereby making a fluid inhaled from the exterior into the micro channel structure through the at least one flow channel, flow through the first chamber and the hollow aperture sequentially, and converged in the second chamber;
a positive voltage is applied to the third loop circuit and the fourth loop circuit to make the movable part of the valve layer and the conductive part of the supporting layer have identical charges, and the movable part of the valve layer and the conductive part of the supporting layer having identical charges are repelled with each other to move, so that the moveable part of the valve layer is displaced in the direction away from the substrate, thereby making the fluid inhaled from the exterior into the micro channel structure through the at least one flow channel continuously, in which a part of the fluid converged to the second chamber is compressed therein and flows toward the periphery of the second chamber; and then electrical properties of the first loop circuit, the second loop circuit, the third loop circuit and the fourth loop circuit are changed respectively, wherein a negative voltage is applied to the first loop circuit, a positive voltage is applied to the second loop circuit, so that the piezoelectric actuation layer drives the suspension part of the vibration layer to move in a direction toward the substrate, wherein a positive voltage is applied to the third loop circuit and a negative voltage is applied to the fourth loop circuit to make the movable part of the valve layer and the conductive part of the supporting layer have opposite charges, so that the movable part of the valve layer and the conductive part of the supporting layer attracted to each other to move, thereby making the moveable part of the valve layer move in the direction toward the substrate, wherein when the movable part of the valve layer is attracted by the conductive part, the movable part abuts against the protruding part of the supporting layer, thereby closing the hollow aperture of the valve layer and obstructing the fluid inhaled into the interior of the micro channel structure from entering the second chamber, wherein the volume of the second chamber is compressed by the suspension part of the vibration layer at the same time, so that the fluid converged in the second chamber is discharged out of the micro channel structure through at least one vacant space to achieve fluid transportation.

15. The manufacturing method of micro channel structure according to claim 1, wherein the vibration layer has a thickness ranged from 1 micrometer to 5 micrometers.

16. The manufacturing method of micro channel structure according to claim 1, wherein the first chamber has a height ranged from 1 micrometer to 5 micrometers.

17. The manufacturing method of micro channel structure according to claim 1, wherein the second chamber has a height ranged from 1 micrometer to 5 micrometers.

18. A manufacturing method of a micro channel structure comprising steps of:
(a) providing at least one substrate, wherein the substrate has at least one first surface and at least one second surface opposite to each other;
(b) depositing and etching to form at least one first insulation layer, wherein at least one insulation material is deposited on the first surface of the substrate to form the first insulation layer and etching is performed to form at least one first aperture and at least one second aperture on the first insulation layer, wherein the at least one second aperture is disposed around the at least one first aperture;
(c) depositing and etching to form at least one supporting layer, wherein at least one conductive material is deposited on the first insulation layer to form the supporting layer, and etching is performed to form at least one protruding part and at least one conductive part;
(d) depositing and etching to form at least one valve layer, wherein an oxide material is deposited on the supporting layer to form at least one first oxide layer, and etching is performed to form at least one first anchor zone, after which at least one conductive material is deposited on the first oxide layer and the first anchor zone to form the valve layer, and the valve layer is etched to form at least one base part with a height, at least one movable part, at least one fixed part, and at least one hollow aperture;
(e) depositing and etching to form at least one second insulation layer, wherein an oxide material is deposited on the valve layer to form at least one second oxide layer, etching is performed to form at least one second anchor zone, after which at least one insulation material is deposited on the second oxide layer and the second anchor zone to form the second insulation layer, and the second insulation layer is etched to form at least one supporting part with a height;
(f) depositing and etching to form at least one vibration layer, at least one lower electrode layer and at least one piezoelectric actuation layer, wherein at least one conductive materials is deposited on the second insulation layer to form the vibration layer, at least one metallic material is deposited on the vibration layer to form the lower electrode layer, and at least one piezoelectric material is deposited on the lower electrode layer to form the piezoelectric actuation layer, wherein the lower electrode layer and the piezoelectric actuation layer are etched to have desired dimensions and to form at least one suspension part, at least one outer frame, at least one connection part and at least one bonding-pad part on the vibration layer, wherein at least one vacant space is formed among the suspension part, the outer frame and the at least one connection part;
(g) providing at least one photoresist layer to deposit and etch a plurality of bonding pads, wherein at least one photoresist material is deposited on the piezoelectric actuation layer and the vibration layer to form the photoresist layer, and the photoresist layer is etched to form a plurality of recess zones, wherein the plurality of recess zones are aligned with the position of the fixed part of the valve layer, the position of the outer frame of the vibration layer, the position of the piezoelectric actuation layer and the position of the bonding-pad part, respectively, after which at least one metallic material is deposited on the plurality of recess zones to form at least one bonding-pad layer and the bonding-pad layer is etched to form the plurality of bonding pads, wherein the plurality of bonding pads are defined as at least one reference electrode bonding pad formed on the bonding-pad part of the vibration layer, at least one upper electrode bonding pad formed on the piezoelectric actuation layer, at least one lower electrode bonding pad formed on a lateral side of the outer frame of the vibration layer, and at least one valve-layer electrode bonding pad formed on the fixed part of the valve layer;
(h) depositing and etching to form at least one mask layer, wherein a silicon oxide material is deposited on the second surface of the substrate to form the mask layer, after which etching is performed to form at least one flow channel and at least one receiving slot in the substrate, wherein the at least one flow channel is spatially corresponding to the position of the at least one second aperture of the first insulation layer, and the receiving slot and the conducive part of the supporting layer are in electrical connection with each other, wherein at least one base electrode bonding pad is formed by filling a polymer conductive material into the receiving slot, so that the base electrode bonding pad and the conducive part of the supporting layer are in electrical connection with each other;

(i) etching to form at least one first chamber, wherein etching is performed through the at least one flow channel of the substrate to release and remove the first oxide layer surrounded by the base part of the valve layer, so as to form the first chamber surrounded by the base part and make the hollow aperture of the valve layer in fluid communication with the first chamber; and (j) etching to form at least one second chamber, wherein etching is performed through the at least one vacant space to release and remove the second oxide layer surrounded by the supporting part of the second insulation layer, so as to form the second chamber surrounded by the supporting part and make the second chamber and the first chamber in fluid communication with each other through the hollow aperture.

* * * * *